(12) United States Patent
Hattori

(10) Patent No.: US 6,900,767 B2
(45) Date of Patent: May 31, 2005

(54) IC CARD

(75) Inventor: Ryoji Hattori, Hino (JP)

(73) Assignee: Konica Corporation (JP)

( * ) Notice: Subject to any disclaimer, the term of this patent is extended or adjusted under 35 U.S.C. 154(b) by 31 days.

(21) Appl. No.: 10/246,211

(22) Filed: Sep. 18, 2002

(65) Prior Publication Data

US 2003/0132302 A1 Jul. 17, 2003

(30) Foreign Application Priority Data

Sep. 28, 2001 (JP) ........................................ 2001-299273

(51) Int. Cl.[7] ............................ H01Q 1/38; G06K 19/06
(52) U.S. Cl. ........................ 343/702; 343/873; 343/895; 235/492
(58) Field of Search .......................... 343/700 MS, 702, 343/866, 867, 873, 895; 235/380, 488, 492

(56) References Cited

U.S. PATENT DOCUMENTS 5,852,289 A * 12/1998 Masahiko .................... 235/492

* cited by examiner

*Primary Examiner*—Michael C. Wimer
(74) *Attorney, Agent, or Firm*—Muserlian, Lucas and Mercanti

(57) ABSTRACT

An IC card comprising: a first sheet member; a second sheet member; and a core layer fixed therein an electronic part by an adhesive agent and provided between the first sheet member and the second sheet member. The electronic part comprises an antenna coil formed by an antenna wire and an IC module comprising an IC chip. The antenna wire has a structure represented by following General Formula 1, $$\text{Antenna Shape } X1 \geq \text{Antenna Shape } Y1 \times 1.2$$

wherein Antenna Shape X1 represents the cross sectional width of the antenna wire being parallel to the surface of the IC card; Antenna Shape Y1 represents the cross sectional width of the antenna wire being perpendicular to the surface of the IC card.

15 Claims, 23 Drawing Sheets

FIRST SHEET MEMBER

SECOND SHEET MEMBER

IC CARD

FIELD OF THE INVENTION

The present invention relates to an IC card which comprises in its interior a non-contact type IC module which stores personal information which requires security against forgery as well as falsification.

BACKGROUND OF THE INVENTION

Heretofore, magnetic cards, which record data employing a magnetic recording system, have widely been employed as, for example, identification cards (ID cards), credit cards, and the like. However, problems have occurred in which since in magnetic cards, it is possible to relatively easily rewrite data, data are not effectively secured from falsification, data are not well protected due to external magnetic effects, and further, the recording capacity is limited.

In some ID cards, for example, the surface comprises portrait (face image) as well as text information and the back surface comprises a writing layer capable of being manually written upon. It is possible to easily prepare such ID cards at low cost due to the recent progress of sublimation printing techniques. As a result, such ID cards have increasingly been employed for the past several years, but have not yet employed as a standard.

IC cards read and write data from external instruments and devices via electric contact points provided on the surface or a loop antenna in the card's interior. Compared to magnetic cards, IC cards have a greater storage capacity and exhibit a pronounced improvement in security. Specifically, non-contact type IC cards, which comprise in their interior an IC chip and an antenna which sends information to and receives information from the exterior, and has no electric contact points, exhibits excellent security compared to contact type IC cards having electric contact points on their surface, and have been employed for use in which data confidentiality as well as security against forgery and falsification are highly demanded in the same manner as in ID cards.

Conventional IC cards have been prepared employing the following methods. For example, IC parts as well as a wireless antenna are placed in container consisting of an upper and a lower cover, which have been prepared by plastic molding and the connecting surface of said upper and lower covers are adhered by thermally fusing. Alternatively, IC parts and a wireless antenna are placed in a groove which has been formed in a sheet material and are sealed employing resins. Subsequently, an image receptive layer holding sheet material is adhered thereon.

The IC cards, which are prepared employing the former method, when printed only with the definite codes without portrait and text information, are prepared at relatively low cost. However, when individual said IC cards are printed with different portrait and text information, it requires a manual operation in such a manner that after printing necessary information on a sheet material, employing a separate apparatus, the resultant sheet material is cut, and is then adhered onto a cover prepared by resin molding. As a result, the resultant IC cards become quite expensive.

In the latter method, a groove is formed in a sheet material. As a result, it is necessary to use a thick sheet material and to compensate for the increase in the thickness by decreasing the thickness of the image receptive layer holding sheet material. When the thickness of said image receptive layer holding sheet material is decreased, the surface of said sheet material corresponding to the portion sealed with resins becomes slightly concave when compared to the surface of the portion due to the difference in materials from the other portion sealed with resins as well as thermal contraction during curing. Due to that, when said image receptive layer is adhered onto the resultant sheet material, a concave portion corresponding to the concave portion of said sheet material is formed. As a result, when the portion above the antenna and IC is printed, color density is lowered or no printing occurs. Due to that, problems occur in which free presentation is limited in such a manner that it is required to carry out a layout on the surface of cards so that the concave portion of the image receptive layer is not printed. Further, even though the surface is smooth, it has been difficult to obtained desired printing characteristics due to the partial difference in heat conductivity. Specifically, from the viewpoint of image reproduction, major problems have occurred in which information comprised of image information such as a portrait image, having gradation characteristics, is printed employing a thermal transfer system.

Further, problems have occurred in which the visual appearance is degraded due to the identification of the position of IC chips when the IC card is exposed to light. In order to make it difficult to identify the IC chip position, the thickness of IC cards is increased to enhance a shielding effect. However, the resultant effect has not been sufficient. Problems have occurred in which the IC chip portion identified as above is destroyed to eliminate personal information so that card issuing industries are troubled.

Still further, when the card surface exhibits irregularities, the IC chip position is detected as noted above. Such IC cards cause problems in poor visual appearance as well as poor resistance against malicious acts.

SUMMARY OF THE INVENTION

In order to overcome the aforesaid problems and achieve aspects described below, the present invention was achieved. An aspect of the present invention is to provide an IC card which is capable of being subjected to a surface smoothening treatment, and of minimizing recording unevenness while minimizing the generation of irregularity and further obtaining durability, by varying the antenna to a specified shape.

Further, another aspect of the present invention is to provide an IC card which is capable of enhancing durability in such a manner that the position of an IC chip section is not easily identified by arranging an IC chip hiding part so as to thwart malicious acts.

Still another aspect of the present invention is to provide an IC card which exhibits excellent smoothness and durability of said card surface.

In order to solve the aforesaid problems and achieve the aforesaid objectives, the present invention is constituted as described below.

Structure 1

An IC card comprising: a first sheet member; a second sheet member; and a core layer fixed therein an electronic part by an adhesive agent and provided between the first sheet member and the second sheet member. The electronic part comprises an antenna coil formed by an antenna wire and an IC module comprising an IC chip. The antenna wire has a structure represented by following General Formula 1, $$\text{Antenna Shape } X1 \geq \text{Antenna Shape } Y1 \times 1.2$$

wherein Antenna Shape X1 represents the cross sectional width of the antenna wire being parallel to the surface of the IC card; Antenna Shape Y1 represents the cross sectional width of the antenna wire being perpendicular to the surface of the IC card.

Structure 2

An IC card comprising: a first sheet member; a second sheet member; and a core layer fixed therein an electronic part by an adhesive agent and provided between the first sheet member and the second sheet member. The electronic part comprises an antenna coil formed by an antenna wire, an IC module comprising an IC chip and a connecting section between the antenna coil and the IC chip. The connecting section has a structure represented by following General Formula 2, $$\text{Antenna Shape } X2 \geq \text{Antenna Shape } Y2 \times 1.2$$

wherein Antenna Shape X2 represents the cross sectional width of the connecting section being parallel to the surface of the IC card; Antenna Shape Y2 represents the cross sectional width of the connecting section being perpendicular to the surface of the IC card.

Structure 3

An IC card comprising: a first sheet member; a second sheet member; and a core layer fixed therein an electronic part by an adhesive agent and provided between the first sheet member and the second sheet member. The electronic part comprises an antenna coil formed by an antenna wire and an IC module comprising a reinforcing plate having thereon an IC chip. The IC card further comprises a IC chip hiding part to hide at least 5% of the IC module.

PREFERRED EMBODIMENTS OF THE INVENTION

The IC card of the present invention will now be detailed with reference to drawings. However, the present invention is not limited to these embodiments.

FIGS. 1 through 5 are cross-sectional views of IC cards.

Figure 1:
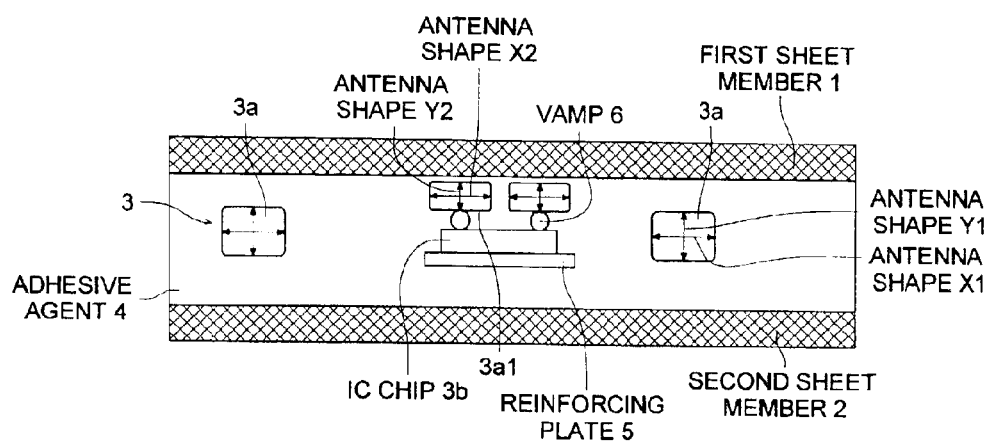
FIG. 1 is a cross-sectional view of an IC card.

The IC card, which is structured as shown in FIG. 1, is prepared as follows. Part 3, comprising single antenna coil 3a comprised of an antenna wire and an IC module comprised of IC chip 3b, is installed at the specified position between two supports which face first sheet member 1 and second sheet member 2 and the residual space between them is filled with adhesive agent 4.

Said IC chip 3b is fixed on reinforcing plate 5. Further, IC chip connecting section 3a1 of antenna coil 3a is connected to IC chip 3b via vamps 6 which are minute electrodes.

In this embodiment, the antenna wire of the antenna coil 3a has the structure represented by General Formula 1 described below:

$$\text{Antenna shape } X1 \geq \text{antenna shape } Y1 * 1.2 \qquad \text{General Formula 1}$$

wherein antenna shape X1 represents the cross sectional width of the antenna wire being parallel to the surface of the IC card, and antenna shape Y1 represents the cross sectional width of the antenna wire being perpendicular to the surface of the IC card.

By employing antenna coil 3a, which is in the antenna shape represented by General Formula 1, IC card surface smoothness as well as durability is enhanced.

Further, the structure of connecting section 3a1 between antenna coil 3a and IC chip 3b is represented by General Formula 2 described below.

$$\text{Antenna shape } X2 \geq \text{antenna shape } Y2 * 1.2 \qquad \text{General Formula 2}$$

wherein antenna shape X2 represents the cross sectional width of the connecting section being parallel to the surface of the IC card, and antenna shape Y2 represents the cross sectional width of the connecting section being perpendicular to the surface of the IC card.

By allowing the structure of the connecting section 3a1 between antenna coil 3a and IC chip 3b to satisfy the relationship represented by General Formula 2, IC card surface smoothness as well as durability is enhanced.

Figure 2:
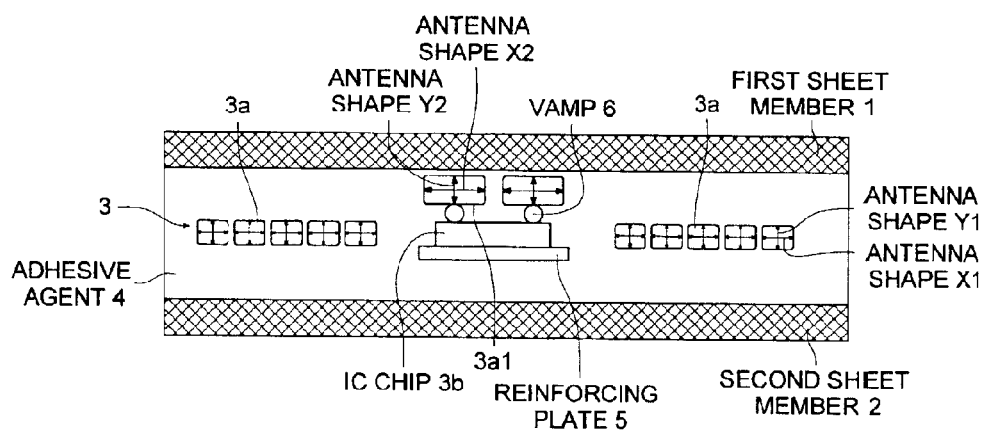
FIG. 2 is a cross-sectional view of another IC card.

The IC card, which has the embodiment as shown in FIG. 2, is prepared in the same manner as the IC card in FIG. 1. However, second sheet member 2 is comprised of thermoplastic resins and five-loop antenna coil 3a, comprised of an antenna wire, is employed.

Figure 3:
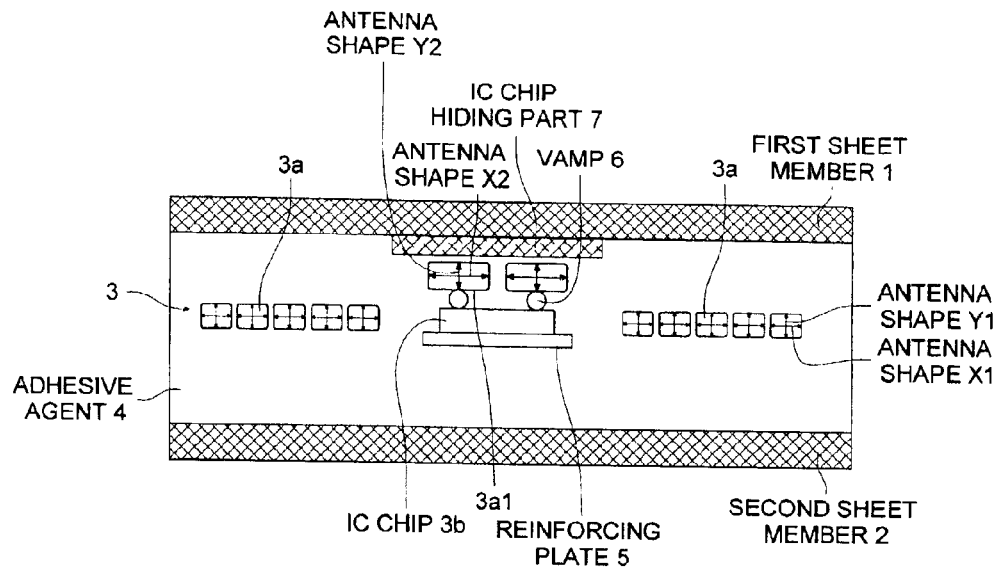
FIG. 3 is a cross-sectional view of still another IC card.

The IC card, which is structured as shown in FIG. 3, is prepared in the same manner as the IC card in FIG. 1. However, five-loop antenna coil 3a, comprised of an antenna wire, is employed, and in order to hide at least 5 percent of IC chip 3b or reinforcing plate 5, IC chip hiding part 7 is provided. It is preferable that the IC chip hiding part 7 hinds not less than 5% of the IC chip or the reinforcing plate, and more preferably not less than 10%. In the present embodiment, IC chip hiding part 7 is formed by printing first sheet member 1.

Figure 4:
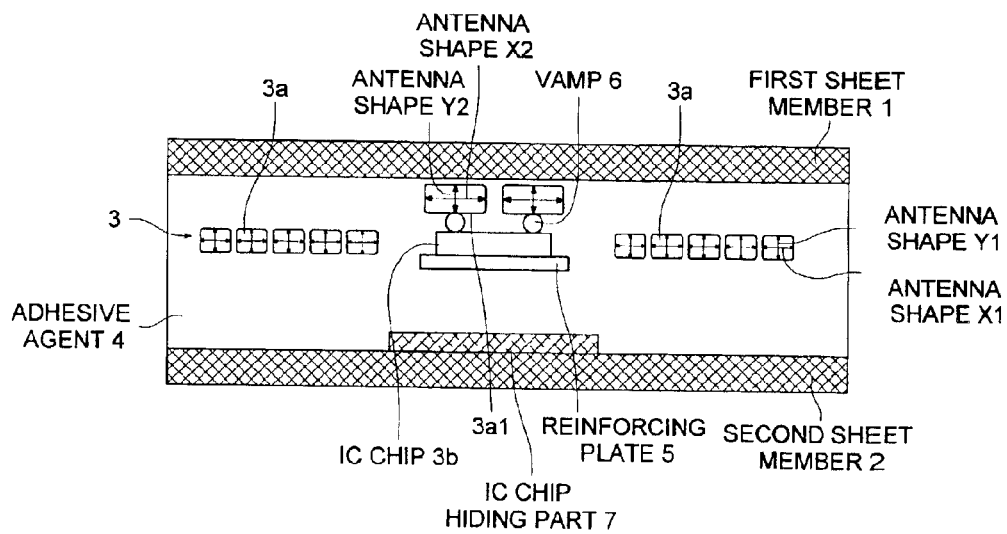
FIG. 4 is a cross-sectional view of yet another IC card.

The IC card structured as shown in FIG. 4 is prepared in the same manner as the IC card in FIG. 3. However, second sheet member 2 is comprised thermoplastic resin, and IC chip hiding part 7 is printed on the thermoplastic resin.

Figure 5:
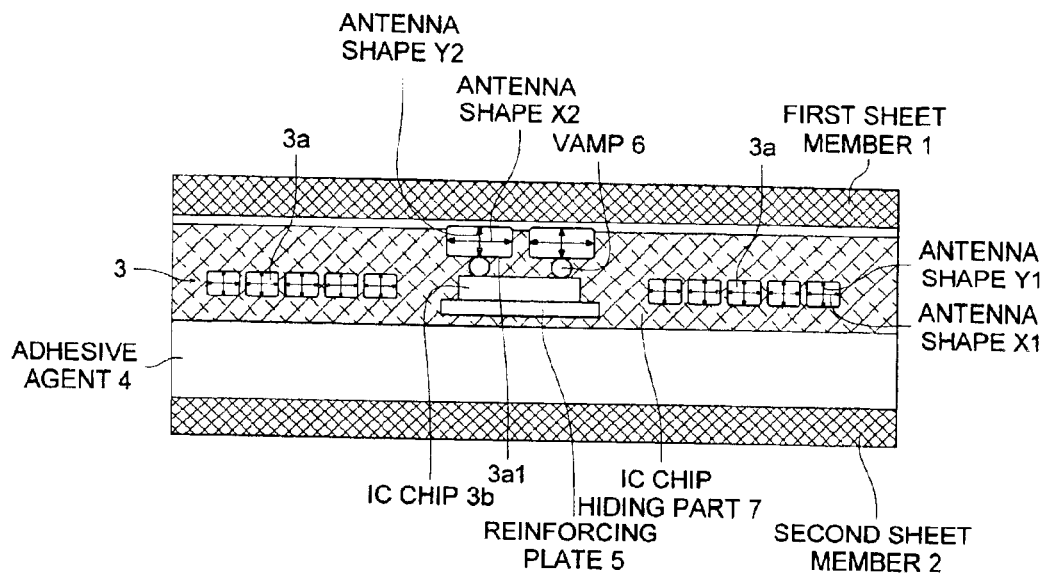
FIG. 5 is a cross-sectional view of one more IC card.

The IC card structured as shown in FIG. 5 is prepared in the same manner as the IC card in FIG. 3. However, second sheet member 2 is comprised of thermoplastic resin; IC chip hiding part 7 is provided on adhesive layer 7; and on said IC chip hiding part 7, parts 3 comprising an IC module comprised of five-loop antenna coil 3a comprised of an antenna wire and IC chip 3b, are arranged.

Figure 7:
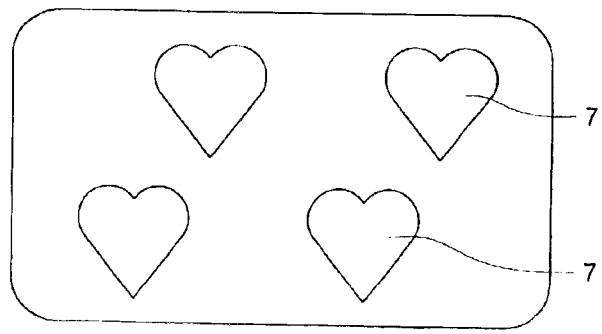
FIG. 7 is a schematic top view of an IC chip hiding part.
Figure 8:
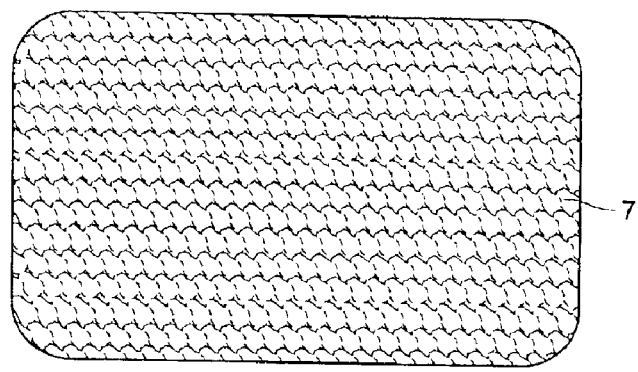
FIG. 8 is a schematic top view of another IC chip hiding part.

FIGS. 7 and 8 are schematic views of IC chip hiding parts, while FIGS. 9 through 12 are top views of IC cards.

IC chip hiding part 7, structured as shown in FIG. 7, is shaped as hearts, which are arranged at a plurality of specified positions, and are employed in the embodiments shown in FIGS. 3 and 4. IC chip hiding part 7, structured as shown in FIG. 8, is formed to show a pattern on the front surface, which is employed in the embodiment shown in FIG. 5.

Figure 9:
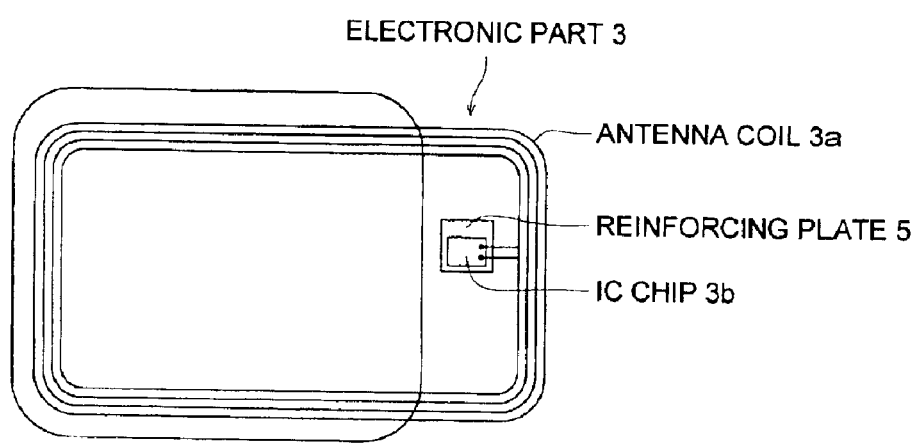
FIG. 9 is a top view of an IC card.
Figure 10:
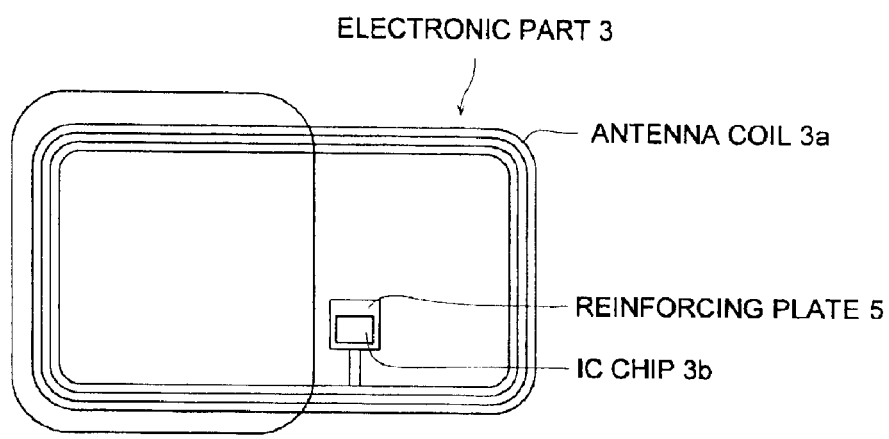
FIG. 10 is a top view of another IC card.
Figure 11:
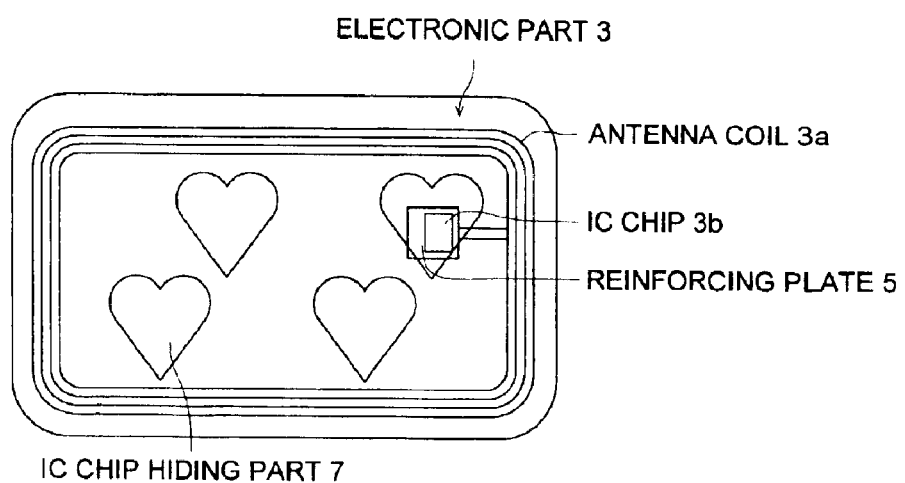
FIG. 11 is a top view of still another IC card.
Figure 12:
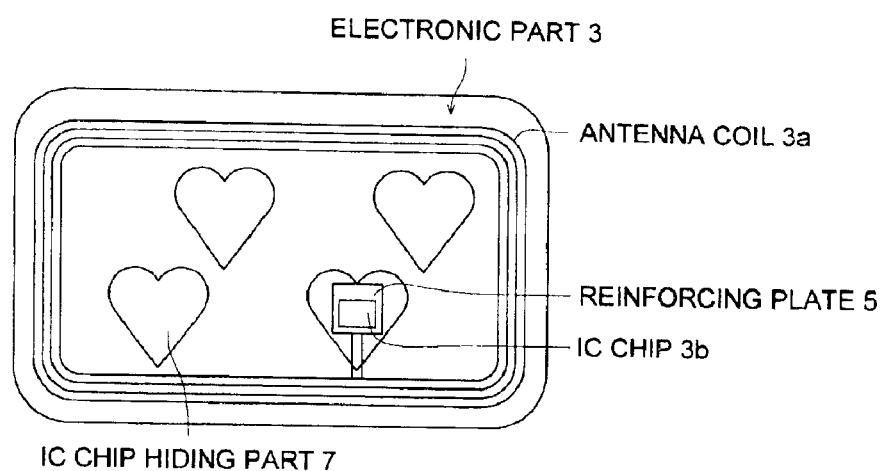
FIG. 12 is a top view of yet another IC card.

In the embodiments shown in FIGS. 9 and 10, four-loop antenna coil 3a comprised of an antenna wire is employed, and the connection position between antenna coil 3a and IC chip 3b differs. In the embodiment shown in FIG. 11, IC chip hiding part in the embodiment shown in FIG. 7 is employed in the IC card shown in FIG. 9, while in the embodiment shown in FIG. 12, IC chip hiding part 7 in the embodiment shown in FIG. 7 is employed in the IC card shown in FIG. 10.

As noted above, in the embodiments shown in FIGS. 3 through 12, in order to shield at least 5 percent of IC chip 3b or reinforcing plate 5, IC chip hiding part 7 is provided, whereby durability and IC chip protection are enhanced.

Further, the IC card comprises at least an image receptive layer on one side. The image receptive layer comprises personal identification information including a name and portrait printed by a sublimation thermal transfer method, a fusion thermal transfer method of an ink jet method. The IC card still further comprises a writing layer, which can be written upon, in at least a part of the surface of the IC card.

Further, adhesive agent employed in the core layer are preferably those which can be employed at relatively low temperature (without heat treatment).

Still further, when a transparent protective layer is provided on personal identification information including names and portrait, said layer is comprised of actinic light curable resins. It is preferable that said personal identification information including names and portrait is protected by said transparent protective layer comprised of actinic light curable resins.

<Specified Antenna Shape>

Employed as antenna coils used in the present invention are coils comprised of copper windings, coils which are prepared by printing conductive paste such as silver paste on an insulation substrate so as to produce an eddy, and coils which are prepared by etching metal foil such as copper foil. In the present invention, from the viewpoint of communication capability, it is preferable to use coils comprised of copper windings. In some cases, said coils may be covered with resins or an insulation layer.

A circuit pattern, including said antenna coils, is preferably a winding type. If desired, coils may be electrically connected employing another process so that shorting with intermediate coils does not occur. The turn frequency of said antenna coil is preferably from 2 to 10. However, said turn frequency is not particularly limited in the present invention.

The structure of the antenna wire is preferably structured so as to satisfy aforesaid General Formula 1. When aforesaid General Formula I is not satisfied, problems occasionally occur in which the smoothness of the card surface is degraded.

Further, the structure of the IC chip connecting section is also preferably structured so as to satisfy aforesaid General Formula 2. It is not preferable that aforesaid General Formula 2 is not satisfied, due to the degradation of the smoothness of the card surface caused by an increase in irregularity of the IC chip section.

Further, it is preferable that the structures of the antenna wire and the connecting section satisfy aforesaid General Formulas 1 and 2 and is structured based on aforesaid General Formulas 3 and 4.

Still further, the shape of said antenna is preferably prepared utilizing pressure adhesion and heat adhesion.

Each of X1, X2, Y1, and Y2 is preferably in the range of 0.1 to 800.0 $\mu$m. When each of them is at least 800 $\mu$m, the winding frequency after forming winding coils decreases, whereby the resultant communication capability is degraded. On the other hand, when each of them is at most 0.1 $\mu$m, problems occur due to frequent wire breakage. In the present invention, each of them is more preferably in the range of 1 to 700 $\mu$m, and is still more preferably in the range of 1 to 600 $\mu$m.

Employed as techniques to connect IC chips to said antenna may be a COB method in which IC chips are mounted on a printed substrate and are connected to said print substrate employing a wire bonding line; a method in which via wiring, a coil connecting pad and coil Cu (copper) line are connected employing soldering materials; a method in which other than a wire bonding line, a vamp is formed on a pad, and a print substrate is connected to solder, employing the Philip chip technique; a method in which IC chips are connected to a substrate employing an anisotropic conductive sheet or a conductive paste; a method in which IC chips are connected employing metal vamps such as Au (gold) on said IC chips; and a method in which a vamp on the IC chip is connect to a substrate employing ultrasonic waves. Further, a reinforcing plate adjacent to the IC chip may be provided. There is no limitation as long as the thickness of said plate is in the range of 20 to 200 $\mu$m.

In order to ensure ease of handling, electronic parts of the present invention, which are comprised of parts such as IC chips, and antenna coils, are preferably fixed, employing porous resins or thermoplastic resins.

<IC Chip Hiding Part>

In the present invention, "IC chip hiding part hides the IC chip or the reinforcing plate" represents that when the IC card is observed visually or is observed by holding the card to light, the IC chip or the reinforcing plate cannot be determined.

The IC chip hiding part can be utilized as a watermark print as well as utilized to hide the electronic part such as IC chip and the antenna coil. To utilize the electronic part and the watermark function of the IC chip hiding part effectively, it is preferable that at least a part of the IC card is not covered with the IC chip hiding part.

When the IC chip hiding part is incorporated in any of the layers which constitute either the first sheet member or the second sheet member, the resulting embodiment is acceptable. When an IC card is prepared, the difference in the transmission density between the portion in which the hiding part for the IC chip section is located and the IC chip layer which is located in the portion in which electronic parts such as IC chips and antenna are not arranged is preferably at most 0.7, and more preferably at most 0.6. The transmission density in the present invention was measured by X-rite 310 Color Transmission/Reflection Densitometer produced by X-Rite, Incorporated.

Said IC chip hiding part comprises colored pigments or colored dyes, metal powder, and dyes. Listed as colored pigments are inorganic pigments such as titanium dioxide, calcium carbonate, zinc oxide, barium sulfate, chrome yellow, cadmium yellow, red iron oxide, ultramarine, Prussian blue, titanium white, magnesium carbonate, silica, talc, and clay, which are employed in printing ink, and organic pigments such as phthalocyanine blue, Hanza yellow, naphthol orange, and toluidine red. Listed as metal powders are brass powder, aluminum powder, and copper powder. Further, preferably employed as colored dyes are oil-soluble dyes, and dispersion dyes. Coloring materials are employed to prepare ink while blended with colorants vehicles and additives known in the art. Further, it is possible to prepare coloring materials having an optional hue while combining a plurality of these colorants.

The IC chip hiding part may be colored from white to black. In addition, employed as coloring materials may be colored inks, known in the art, such as offset ink and gravure ink which are commonly employed in printing. In addition, it is possible to blend waxes, thermoplastic resins, minute inorganic particles, leveling agents, elastic rubber particles, thermoplastic elastomers, thermoplastic resins such as polyolefins, vinyl chloride based resins, and ABS resins, light hardening resins, adhesives, hardening catalysts, flowing agents, planar particles, needle particles, and other additives.

The content ratio of pigments in the IC chip hiding part is commonly from 0.5 to 50.0 percent by weight, and is preferably from 5.0 to 40.0 percent by weight. In this case, the layer thickness is preferably from 0.1 to 10.0 $\mu$m, and is more preferably from 0.1 to 5.0 $\mu$m.

The aforesaid IC chip hiding part may be provided employing any of several methods such as wash-off resin relief printing, offset printing, silk printing, flexographic printing, and screen gravure printing. In the present invention, mixing dispersion methods are not particularly limited, and mixing dispersion may be carried out employing various apparatus such as all-round stirrers, roll mixers, homogenizers, and kneaders. A mixing dispersion method may be selected which is suitable for the given compositions.

In order to prepare the IC chip hiding part, porous resins as well as thermoplastic resins, which are employed in fixing electronic parts, may be used upon being colored. They may be colored employing the aforesaid pigments and dyes. In this case, the layer thickness is preferably from 1.0 to 500.0 $\mu$m, and is more preferably from 5.0 to 400.0 $\mu$m.

<Sheet Member for IC Card Base Materials>

Listed as base materials of the first sheet member and the second sheet member which are sheet members for IC card base materials are, for example, polyester resins such as polyethylene terephthalate, polybutylene terephthalate, polyethylene terephthalate/isophthalate copolymers; polyolefin resins such as polyethylene, polypropylene, and polymethylpentane; polyethylene fluoride based resins such as polyvinyl fluoride, polyvinylidene fluoride, polyethylene tetrafluoride, and ethylene-ethylene tetrafluoride copolymers; polyamides such as nylon 6 and nylon 6.6; vinyl polymers such as polyvinyl chloride, vinyl chloride/vinyl acetate copolymers, ethylene/vinyl acetate copolymers, ethylene/vinyl alcohol copolymers, polyvinyl alcohol, and vinylon; biodegradable resins such as biodegradable aliphatic polyester, biodegradable polycarbonate, biodegradable polylactic acid, biodegradable polyvinyl alcohol, biodegradable cellulose acetate, and biodegradable polycaprolactone; cellulose based resins such as cellulose triacetate and cellophane; acryl based resins such as methyl polymethacrylate, ethyl polymethacrylate, ethyl acrylate, and butyl polyacrylate; synthetic resin sheets such as polystyrene, polycarbonate, polyallylate, and polyimide; or paper such as fine-quality paper, thin leaf paper, glassine paper, and sulfate paper; and single layer bodies such as metal foils or at least two layer laminated bodies thereof. The thickness of the supports of the present invention is commonly from 30 to 300 $\mu$m, and is preferably from 50 to 200 $\mu$m.

In the present invention, upon taking into account adverse effects due to the thermal contraction, as well as the curl of the supports on the transportability of card base materials, it is preferable that the thermal contraction ratio in the longitudinal direction (MD) and that in the lateral direction (TD) of said sheet member are preferably at most 1.2 percent and at most 0.5 percent at 150° C./30 minutes, respectively. Further, in order to enhance adhesion during any post treatment, the aforesaid support may be subjected to a simple contact treatment. In addition, in order to protect chips, an antistatic treatment may be performed. Specifically, it is possible to suitably employ U2 Series, U3 Series, U4 Series, and UL Series, manufactured by Teijin Dupont Film Co., Ltd.; Crisper G Series, manufactured by Toyobo Co., Ltd.; and E00 Series, E20 Series, E22 Series, X20 Series, E40 Series, E60 Series, and QE Series, manufactured by Toray Co., Ltd.

In order to incorporate a photo of the bearer in said card, the second sheet material of the present invention may be provided with a cushioning layer other than an image receptive layer. Image elements are provided on the surface of a personal identification card base body, and at least one selected from an identification image such as a portrait, attribute information image, and format printing may be provided. On the other hand, a white card having no printing portion is also be acceptable.

<Image Receptive Layer Receiving Sublimation or Thermal Diffusion Dye Image Employing Thermal Transfer Recording Method>

It is possible to prepare the image receptive layer comprising the second sheet member, employing binders and various types of additives.

In the image receptive layer of the present invention, gradation information containing images are formed employing the sublimation thermal transfer method, while text information containing images are formed employing either the sublimation thermal transfer method or the fusion thermal transfer method. As a result, desired dyeability for sublimation dyes should result, or desired dyeability for sublimation dyes as well as desired adhesion for wax ink should result. In order to provide such specific properties to the image receptive layer, as described below, it is necessary to select appropriate types of various additives and adjust blending amounts thereof.

Components, which constitute the image receptive layer, will now be detailed.

Suitably employed as binders for said image receptive layer in the present invention are those used for commonly known sublimation transfer recording image receptive layers. Employed as major binders may be various binders such as vinyl chloride based resins, polyester based resins, polycarbonate based resins, acryl based resins, styrene based resins, polyvinyl acetal based resins, and polyvinyl butyral based resins.

However, provided that there are practical requirements (for example, an issued ID card is required to have a specified thermal resistance) with respect to images formed according to the invention, the kind or combination of binders has to be considered to satisfy the requirements. For instance, if thermal resistance of the images is in question and a thermal resistance at 60° C. and higher is required, binders having a Tg of lower than or equal to 60° C. are preferably used, taking bleeding of sublimation dyes into consideration.

Further, when the image receptive layer is formed, there may be a case in which, if desired, metal ion containing compounds are preferably incorporated. Specifically preferable is the case in which a thermal-transferable compound reacts with the metal ion containing compound to form a chelate.

Metal ions, which compose the metal-ion containing compounds described above, include, for example, divalent or multivalent metals belonging to groups I and group VIII in the Periodic Table. Of these, preferred are Al, Co, Cr, Cu, Fe, Mg, Mn, Mo, Ni, Sn, Ti, and Zn, and of these, particularly preferred are Ni, Cu, Co, Cr, and Zn. Preferable compounds containing these metal ions are inorganic or organic salts of the metals and complexes of those metals. Examples include complexes, comprising $Ni^{2+}$, $Cu^{2+}$, $Co^{2+}$, $Cr^{2+}$ and $Zn^{2+}$, represented by the General Formula described below:

$$[M(Q_1)_k(Q_2)_m(Q_3)_n]^{p+}p(L^-)$$

wherein M represents a metal ion, $Q_1$, $Q_2$, and $Q_3$ each represents a coordination compound which can form a coordination bond with metal ions represented by M, and the coordination compounds may be selected from those described, for example, in "Chelate Kagaku (5) (Chelate Chemistry (5)" (published by Nankoh Do). Particularly preferred examples include coordination compounds having at least one amino group which can form a coordination bond with a metal, and more specifically include ethylenediamine and derivatives thereof, glycineamide and derivatives thereof, and picolineamide and derivatives thereof.

L represents a counter anion which can form complexes, including inorganic compound anions such as Cl, $SO_4$ and $ClO_4$, and organic compound anions such as benzenesulfonic acid derivatives, and alkylsulfonic acid derivatives, and specifically preferable are an anion of tetraphenylboron and derivatives thereof, and an anion of alkylbenzenesulfonic acid and derivatives thereof. "k" represents an integer of 1, 2 or 3; m represents an integer of 1, 2 or 0; n represents an integer of 1 or 0. However, said integer is determined depending on whether the complex represented by the general formula described above is tetradentate or hexadentate, or depending on the number of ligands of $Q_1$, $Q_2$ and $Q_3$. "p" represents an integer of 1, 2 or 3.

Listed as examples of this kind of metal ion containing compounds may be those exemplified in U.S. Pat. No. 4,987,049. In case of adding the metal ion containing compounds described above, the added amount is preferably 0.5 to 20.0 $g/m^2$ with respect to the image receptive layer, and is more preferably 1 to 15 $g/m^2$.

Further, releasing agents are preferably added to the image receptive layer. Effective releasing agents are preferably compatible with the binder used, and specifically include modified silicone oil and modified silicone polymers such as amino-modified silicone oil, epoxy-modified silicone oil, polyester-modified silicone oil, acryl-modified silicone resins and urethane-modified silicone resins. of these, polyester-modified silicone oil is specifically superior in respect to preventing melt adhesion with the ink sheet but not in disturbing ease of secondary processing of an image receptive layer. The ease of secondary processing of an image receptive layer, as described herein, refers to processes such as writability with Magic ink and laminating properties which are required when the images and letters have to be protected. Further, fine particles such as silica are also effective as a releasing agent. In case the ease of secondary processing is not a problem, curable silicone compounds may be effectively utilized as a prevention means of melt adhesion. UV curable silicone, reaction-curable silicone, etc. are commercially available, and excellent releasing effect can be achieved.

The image receptive layer of the present invention can be manufactured by a coating method in which the image receiving layer coating composition, in which integral components are dissolved or dispersed in a solvent, is prepared, being applied onto the surface of a support described above and subsequently dried.

The thickness of an image receptive layer, formed on the surface of a support, is commonly from 1 to 50 $\mu$m, and is preferably from about 2 to 10 $\mu$m. In the present invention, a cushioning layer as well as a barrier layer may be provided between the support and the image receptive layer. When said cushioning layer is provided, it is possible to transfer recording images in accordance with image information so as to result in desired reproduction under minimal noise. Listed as materials to compose said cushioning layer are, for example, urethane resins, acryl resins, ethylene based resins, polypropylene based resins, butadiene rubber, epoxy resins, and photocurable resins described in Japanese Patent Publication Open to Public Inspection No. 2001-16934. The thickness of said cushioning layer is commonly from 1 to 50 $\mu$m, and is preferably from 3 to 30 $\mu$m.

In the present invention, it is possible to provide an information bearing body layer comprised of format printing on the image receptive layer.

The information bearing body comprised of format printing, as described herein, refers to an information bearing body which bears at least one item selected from identification information and text information which have been recorded, and specifically refers to ruled lines, company names, card names, warnings, and the telephone number of a card issuing company.

It is possible to form said information bearing body comprised of format printing, employing common inks which are described in, "Heihan Insatsu Gijutsu (Lithographic Technology)", "Shin Insatsu Gijutu Gairon (An Outline of New Printing Technology), "Seihan Insatsu Hayawakari Zukan" (Illustrated Guide to Plate-Making and Printing), published by Nippon Insatsu Gijutsu Kyokai. Said inks include photocurable ink, oil-soluble ink, solvent type ink, and carbon.

Further, in order to visually thwart forgery, if desired, water mark printing, holograms, and fine patterns may be available. Appropriately selected as forgery and falsification thwarting layer are printed matters, holograms, bar codes, matted patterns, fine tints, and ground tints and irregular patterns. Said layer may be provided on the front sheet through printing, while employing any of visual light absorbing materials, UV absorbing materials, infrared ray absorbing materials, optical brightening materials, metal evaporated layers, glass evaporated layers, bead layers, optical variable device layers, pearl ink layers, scale pigment layers, and antistatic layers.

<Cushioning Layer>

Polyolefins are preferably employed as materials to form the cushioning layer of the present invention. Any, which exhibit flexibility analogous to that of the photocurable resinous layer and exhibit low heat conductivity, are suitable, and include, for example, polyethylene, polypropylene, ethylene-vinyl acetate copolymers, ethylene-ethyl acrylate copolymers, styrene-butadiene-styrene block copolymers, styrene-isoprene-styrene block copolymers, styrene-ethylene-butadiene-styrene block copolymers, styrene-hydrogenated isoprene-styrene block copolymers, and polybutadiene. Specifically, it is possible to use the cushioning layer described in Japanese Patent Application No. 2001-16934.

The cushioning layer, as described in the present invention, is not particularly limited, as long it is incorporated between the image receptive layer and the electronic parts. Said cushioning layer may be formed through coating or adhesion on the surface of the first sheet member, or on the surface of both first sheet and second sheet members, which comprise another support having substantially the same materials as the aforesaid base body.

<Write-Able Layer>

The write-able layer (writing layer) refers to the layer which allows the writing on the rear surface of ID cards. It is possible to form such writing layers by incorporating, in a thermoplastic resin (polyolefins such as polyethylene and various copolymers) film, fine organic powders such as calcium carbonate, talc, diatomaceous earth, titanium oxide, and barium sulfate. It is also possible to from said writing layer, based on "writing-on layer" described in Japanese Patent Publication Open to Public Inspection No. 1-205155. The aforesaid writing layer is formed on the first sheet member, onto which a plurality of layers are not laminated in the support.

<Low Temperature Adhesives>

Employed as hot melt adhesives used in the IC card of the present invention may be those commonly used. Listed as major components of said hot melt adhesives are, for example, ethylene-vinyl acetate copolymers (EVA) series, polyester series, polyamide series, thermoplastic elastomer series, and polyolefin series. In the present invention, however, when said hot melt adhesives are employed, adhesion temperature is preferably at most 80° C., is more preferably from 10 to 80° C., and is still more preferably from 20 to 80° C. The reasons are as follows. At high temperature, the card base body tends to curl. Further, when layers such as an image receptive layer, which is employed to form images utilizing thermal transfer, which exhibit low resistance against high temperature process is provided on a card surface, said layer may be damaged due to heat. Alternatively, base material employed for adhesion at relatively high temperature results in thermal contraction which degrades sizes accuracy as well as position accuracy of during adhesion.

Japanese Patent Publication Open to Public Inspection Nos. 2000-036026, 2000-219855, 2000-211278, and 2000-219855, and Japanese Patent Application No. 2000-369855 disclose moisture curable materials as a reactive hot melt adhesive, while Japanese Patent Publication Open to Public Inspection Nos. 10-316959 and 11-5964 disclose photocurable adhesives.

Either of these adhesives may be employed.

The thickness of the adhesive layer including electric parts is preferably from 10 to 600 $\mu$m, is more preferably from 10 to 500 $\mu$m, and is still more preferably from 10 to 450 $\mu$m.

<Method for Preparing Electronic Parts>

Herein is listed one example of a method for preparing electronic parts. The maximum thickness is not limited to the value described below, but is preferably from 1.0 to 500.0 $\mu$m, and is more preferably from 5.0 to 400.0 $\mu$m.

(Electronic Part 1)

Electronic part 1 comprised of an IC chip, a plurality of vamps comprised of metal such as Au (gold) which were provided on said IC chip, and an antenna specifically shaped according to the present invention. In said part 1, said antenna and said chip are arranged so that both are interposed between the top side and the bottom side. A porous resin was employed to fix said electronic parts. The maximum thickness of the chip section is to be 270 $\mu$m.

(Electronic Part 2)

Electronic Part 2 was prepared in the same manner as Electronic Part 1, except that black dyed porous resin was employed to shield the IC. The maximum thickness of the chip section is to be 270 $\mu$m.

<Method for Preparing IC Cards>

Listed herein is one example of a method for preparing the IC card of the present invention, which employs a hot melt adhesive. When said IC card is prepared, initially, said hot melt adhesive is applied onto both sides of a sheet, employing an applicator, so as to obtain the specified thickness. Employed as coating methods are common methods such as a roller method, a T die method and a dice method.

In the present invention, stripe-shaped coating is carried out, employing a method in which a T die slit is intermittently opened. However, methods are not limited to the forgoing. Further, irregularity on the surface of the adhesive layer is formed employing a method in which the surface of the adhesive layer coated as above is subjected to a pressing treatment employing an embossing roller. An IC member is placed between the upper and lower sheets which have been coated with said adhesive. Before placement, the coated adhesive may be heated employing a heater. Thereafter, an assembly prepared by placing said IC member between the upper and lower sheets may be pressed for a specified time, employing a press which has been heated to the adhesion temperature of said adhesive. Alternatively, instead of using a press, rolling may be applied to sheets while transported in a thermostat at the specified temperature. Still further, in order to minimize the inclusion of air bubbles during adhesion, a vacuum press may be employed. After adhesion employing the press and the like, the resultant sheets may be subjected to die-cutting to the specified shape or may be cut into cards, whereby cards are prepared. When reactive adhesives are employed as an adhesive, the resultant sheets are set aside over the specified period for reaction, and then cut into cards. In order to promote hardening, a method is useful in which holes to supply water necessary for the reaction are made in the periphery of the card.

In the present invention, when a base material is prepared in a card on size, the following production method is listed. For example, the first sheet material is adhered to the second sheet material via adhesives, and after adhesion, a method is selected in which the laminated sheet base material is molded to the card on size. Mainly selected as the methods to mold on the card size, are a die-cutting method and an ordinary cutting method.

(Thermocurable Resinous Layer)

In the present invention, employed as thermocurable resin compositions, which are employed to prepare the protective layer of the image recording body of the IC card, may be those which are comprised of resins such as epoxy series, polyester series, and acryl series, hardeners, hardening catalysts, flow inducing agents and other additives.

Compositions of polyester resins are preferably comprised of aromatic dicarboxylic acids such as terephthalic acid and isophthalic acid as a main carboxylic acid component, and aliphatic diols such as ethylene glycol and neopentyl glycol as a main diol component. Further, said compositions, which are further comprised of a small amount of aliphatic dicarboxylic acids such as adipic acid and azelaic acid; trivalent or higher valent carboxylic acids such as trimellitic acid, and pyromellitic acid; and trihydric or higher hydric alcohols such as trimethylolethane, trimethylolpropane, and pentaerythritol, are preferred, since the resultant melt fluidity as well as crosslinking ability is enhanced.

Further, the average degree of polymerization of said polyester resins is preferably in the range of 5 to 50. When the average degree of polymerization is less than the lower limit, the resultant cast film does not exhibit sufficient strength, while when it exceeds the upper limit, it is difficult to pulverize the resultant resins. With regard to hardeners, compounds, in which the terminal group of polyester is an —OH type, include isocyanate compounds and melamine resins such as $\epsilon$-caprolactam block isocyanate and methylated melamine. Compounds, in which the terminal group is a —COOH type, include epoxy resins and triglycidylisocyanurate.

(Photocurable Resinous Layer)

The photocurable resinous layer, as a protective layer of the image recording body, is comprised of elements which result in addition polymerization or ring-opening polymerization. The addition polymerizable compounds, as described herein, may be radically polymerizable compounds such as photocurable materials employing photopolymerizable (including thermally polymerizable) compositions, which are described in, for example, Japanese Patent Publication Open to Public Inspection No. 7-159983 and Japanese Patent Application No. 7-231444. Known as addition polymerizable compounds are cation polymerization based photocurable materials. Recently, light cation polymerization based photocurable materials, which are sensitized to the longer wavelength region than visible light, are disclosed in, for example, Japanese Patent Publication Open to Public Inspection No. 6-43633. Compositions of hybrid type polymerization based photocurable materials are disclosed in Japanese Patent Publication Open to Public Inspection No. 4-181944. Specifically, said photocurable layer comprises any of the aforesaid cation based initiators, cationically polymerizable compounds, radical based initiators, radically polymerizable compounds. In order to achieve the purposes of the present invention, any of these photocurable layers may be employed.

(Radical Polymerization Initiators)

Listed as radical polymerization initiators are triazine derivatives described in Japanese Patent Publication Nos. 59-1281, 61-9621 and Japanese Patent Publication Open to Public Inspection No. 61-60104; organic peroxides described in Japanese Patent Publication Open to Public Inspection Nos. 59-1504 and 61-243807; diazonium compounds described Japanese Patent Publication Nos. 43-23684, 44-6413, and 47-1604, and U.S. Pat. No. 3,567,453; organic azides described in U.S. Pat. Nos. 2,848,328, 2,852,379, and 2,940,853; ortho-quinone diazides described in Japanese Patent Publication Nos. 36-22062, 37-13109, 38-18015, and 45-9610; various onium compounds described in Japanese Patent Publication No. 55-39162, Japanese Patent Publication Open to Public Inspection No. 59-14023 and in "Macromolecules", Volume 10, page 1307 (1977), azo compounds described in Japanese Patent Publication Open to Public Inspection No. 59-142205, metal allene complexes described in Japanese Patent Publication Open to Public Inspection No. 1-54440, European Patent Nos. 109,851, and 126,712, and in Journal of Imaging Science, Volume 30, page 174 (1986), (oxo)sulfonium organic boron complexes described in Japanese Patent Publication Open to Public Inspection Nos. 5-213861, and 5-255347, titanocenes described in Japanese Patent Publication Open to Public Inspection No. 61-151197, transition metal complexes, containing transition metals such as ruthenium, described in "Coordination Chemistry Review" Volume 85, pages 85 through 277 (1988) and Japanese Patent Publication Open to Public Inspection No. 2-182701, 2,4,5-triarylimidazole dimer described in Japanese Patent Publication Open to Public Inspection No. 3-209477 and organic halogen compounds such as carbon tetrabromide described in Japanese Patent Publication Open to Public Inspection No. 59-107344. These polymerization initiators are preferably contained in the range of 0.01 to 10.00 parts by weight based on 100 parts of the compound having a radically polymerizable ethylenic unsaturated bond.

Without any limitation, it is possible to incorporate in photosensitive compositions comprising radically polymerizable compounds radical polymerization initiators known in the art, which are commonly employed in the polymer synthesis reaction based on radical polymerization as a thermal polymerization initiator of radically polymerizable monomers. The thermal polymerization initiators, as described herein, refer to compounds which are capable of generating polymerization initiating radicals upon being provided with thermal energy.

Listed as such compounds may be, for example, azobisnitrile based compounds such as 2,2'-azobisisobutylonitrile, 2,2'-azobispropionitrile; organic peroxides such as benzoyl peroxide, lauroyl peroxide, acetyl peroxide, t-butylperbenzoic acid, $\alpha$-cumylhydroperoxide, di-t-butyl peroxide, diisopropyl peroxydicarbonate, t-butyl peroxyisopropyl carbonate, peroxides, alkylperoxycarbamates, nitrosoarylacylamines; inorganic peroxides such as potassium persulfate, ammonium persulfate, and potassium perchlorate; azo or diazo based compounds such as diazoaminobenzene, p-nitrobenzenediazonium, azobis-substituted alkanes, diazothioethers, and arylazosulfones; nitrosophenylurea; tetramethylthiuram disulfide; diaryl disulfides; dibenzoyl disulfide, tetraalkylthiuram disulfides; dialkylxanthogenic acid disulfides; arylsulfinic acids; arylalkylsulfones; and 1-alkansulfinic acid.

Of these, particularly preferable compounds are those which exhibit excellent stability at room temperature, as well as a high decomposition rate during heating, and become colorless when decomposed. The proportion of initiators is preferably in the range of 0.1 to 30 percent by weight with respect to the total polymerizable composition, and is more preferably in the range of 0.5 to 20 percent by weight.

(Radical Polymerization Based Photocurable Resins)

Radically polymerizable compounds, which are incorporated in radically polymerizable compositions, include commonly known photopolymerizable compounds and heat-polymerizable compounds. Radically polymerizable compounds have a radically polymerizable ethylenic unsaturated bond, and any compound having at least one radically polymerizable ethylenic unsaturated bond in the molecule may be used, including chemical forms such as a monomer, oligomer and polymer. Radically polymerizable compounds may be used individually or in combination of at least two types under an optional ratio to enhance target characteristics.

Listed as examples of radically polymerizable compounds, having an ethylenic unsaturated bond, are unsaturated carboxylic acids such as acrylic acid, methacrylic acid, itaconic acid, crotonic acid, isocrotonic acid, and maleic acid, and salts and esters thereof; urethane, amides, anhydrides, acrylonitrile, as well as various radically polymerizable compounds such as unsaturated polyesters, unsaturated polyethers, unsaturated polyamides and unsaturated polyurethanes.

Listed as specific examples are acrylic acid derivatives such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethyleneglycol diacrylate, polypropylene glycol diacrylate, pentaerythritol acrylate, pentaerythritol tetraacrylate, dipentaerythritol tetraacrylate, trimethylolpropane triacrylate, tetramethylolmethane tetraacrylate, oligoester acrylate, N-methylol acrylamide, diacetone acrylamide and epoxy acrylate; methacrylic acid derivatives such as methyl methacrylate, n-butyl methacrylate, 2-ethylhexyl methacrylate, lauryl methacrylate, allyl methacrylate, glycidyl methacrylate, benzyl methacrylate, dimethyl aminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane dimethacrylate, trimethylolpropane dimethacrylate, and 2,2-bis(4-methacryloxypolyethoxyphenyl)propane; as well as derivatives of allyl compounds, such as allyl glycidyl ether, diallyl phthalate and triallyl trimellitate. Further, specifically employed are radically polymerizable or crosslinking monomers, oligomers and polymers, which are commercially available or known in the art, described in "Kakyozai Handbook (Handbook of Crosslinking Agents)", edited by Shinzo Yamashita (1981, Taisei Sha.), "UV·EB Kohka Handbook (Genryo Hen)(UV·EB Curing Handbook (Raw Materials Part)", edited by Kiyoshi Kato (1985, Kohbunshi Kankoh Kai), "UV•EB Kohka Gijutsu no Ohyoh to Shjoh (Application and Market of UV•EB Curing Technology)", edited by Radotech Kenkyu Kai, page 79 (1989, CMC), and "Eiichiroh Takiyama, "Polyester Jushi Handbook (Handbook of Polyester Resins)" (1988, Nikkan Kogyo Shimbun Co.). The addition amount of the aforesaid radically polymerizable compounds in the radically polymerizable composition is preferably from 1 to 97 percent by weight, and is more preferably from 30 to 95 percent by weight.

(Acid Crosslinking Based Photocurable Resins)

Crosslinking agents employed in acid crosslinking compositions of the present invention are compounds which result in a crosslinking reaction, utilizing acid generated from the aforesaid compound specified in the present invention through exposure to actinic light or radioactive rays. The crosslinking agents, which are suitably employed in the present invention, are compounds having at least two of a hydroxymethyl group, an alkoxymethyl group, an epoxy group, or a vinyl ether group in the molecule. Preferred compounds are those in which these crosslinking functional groups directly bond to the aromatic ring. Listed as specific examples are methylolmelamine, resol resins, epoxy-modified novolac resins, and urea resins. Further, compounds are preferred which are described in Shinzo Yamashita and Tohsuke Kaneko, "Kakyozai Handbook (Handbook of Crosslinking Agents)" (Taisei Co.). Specifically, phenol derivatives having at least two hydroxymethyl groups or alkoxymethyl groups in the molecule are preferred because the portion of the resulting images exhibits desired strength. Specifically listed as such phenol derivatives may be resol resins.

However, these crosslinking agents are unstable against heat. As a result, stability during storage after preparing image recording materials is not sufficient. On the other hand, phenol derivatives, having in their molecule at least two of a hydromethyl group or an alkoxymethyl group which bonds to the benzene ring, as well as having a molecular weight of at most 1,200, exhibit desired stability during storage and are most suitably employed. Said alkoxymethyl group preferably has at most 6 carbon atoms. Specifically preferred are a methoxymethyl group, an ethoxymethyl group, an n-propoxymethyl group, an isopropoxymethyl group, an n-butoxymethyl group, an isobutoxymethyl group, a sec-butoxymethyl group, and a t-butoxymethyl group. In addition, preferred are alkoxy substituted alkoxymethyl groups such as a 2-methoxyethoxymethyl group and 2-methoxy-1-propoxymethyl group. Listed as specific compounds may be those described in Japanese Patent Publication Open to Public Inspection Nos. 6-282067 and 7-64285, and European Patent No. 632,003A1.

Listed as other crosslinking agents, which are preferably employed in the present invention, may be aldehydes and ketones. Compounds having at least two aldehydes or ketones in their molecule are preferred.

In the present invention, the content ratio of crosslinking agents is commonly from 5 to 70 percent by weight with respect to the total solids of the image recording material, and is preferably from 10 to 65 percent by weight. When the proportion of crosslinking agents is less than 5 percent by weight, the layer strength of the image portion of the recorded image is lowered. On the other hand, when said proportion exceeds 70 percent by weight, the resistant stability during storage is not acceptable. These crosslinking agents may be employed individually or in combinations of at least two types.

(Cation Based Polymerization Initiators)

Preferably employed as initiators are cationic polymerization ones. Listed as specific examples may be aromatic onium salts. Further, listed as said aromatic onium salts may be salts of elements of group Va in the Periodic Table such as phosphonium salts (for example, hexafluorophosphoric acid triphenylphenacylphosphnium) and salts of elements of group VIa such as sulphonium salts (for example, tetrafluoroboric acid triphenylsulfonium, hexafluorophosphoric acid triphenylsulfonium, hexafluorophosphoric acid tris(4-thiomethoxyphenyl), and sulfonium and hexafluoroantimonic acid triphenylsulfonium), and salts of elements of group VIIa such as iodonium salts (for example, diphenyliodonium chloride).

The use of such aromatic onium salts as the cationic polymerization initiator in polymerization of epoxy compounds is described in U.S. Pat. Nos. 4,058,401, 4,069,055, 4,101,513, and 4,161,478.

Listed as preferable cationic polymerization initiators are sulfonium salts of elements of group VIa. Of these, from the viewpoint of UV curability and storage stability of UV curable compositions, hexafluoroantimonic acid triarylsulfonium is preferred. Further, it is possible to optionally employ photopolymerization initiators, known in the art, which are described on pages 39 through 56 of "Photopolymer Handbook" (edited by Photopolymer Konwa Kai, published by Kogyo Chosa Kai, 1989), and compounds described in Japanese Patent Publication Open to Public Inspection Nos. 64-13142 and 2-4804.

(Cationic Polymerization Based Photocurable Resins)

Listed as UV curable epoxy type prepolymers, which form polymers through cationic polymerization, may be prepolymers which have at least two epoxy groups in one molecule. Listed as such prepolymers may be, for example, alicyclic polyepoxides, polyglycidyl esters of polybasic acids, polyglycidyl ethers of polyhydric alcohols, polyglycidyl ethers of polyoxyalkylene glycol, polyglycidyl ethers of aromatic polyols, hydrogenated compounds of polyglycidyl ethers of aromatic polyols, and polyoxylated butadienes. These prepolymers may be employed individually or in combination of at least two types.

The content of prepolymers which have at least two epoxy groups in one molecule is preferably at least 70 percent by weight. Listed as cationically polymerizable compounds incorporated in a cationically polymerizable composition may be, for example, (1) styrene derivatives, (2) vinylnaphthalene derivatives, (3) vinyl ethers, and (4) N-vinyl compounds described below:

(1) Styrene Derivative Examples:

For example, styrene, p-methylstyrene, p-methoxystyrene, β-methylstyrene, p-methyl-β-methylstyrene, α-methylstyrene, and p-methoxy-β-methylstyrene, (2) Vinylnaphthalene Derivative Examples:

For example, 1-vinylnaphthalene, α-methy-1-vinylnaphthalene, β-methy-1-vinylnaphthalene, 4-methyl-1-vinylnaphthalene, and 4-methoxy-1-vinylnaphthalene, (3) Vinyl Ether Examples:

For example, isobutyl vinyl ether, ethyl vinyl ether, phenyl vinyl ether, p-methylphenyl vinyl ether, p-methoxyphenyl vinyl ether, α-methylphenyl vinyl ether, β-methylisobutyl vinyl ether, β-chloroisobutyl, and vinyl ether, and (4) N-vinyl Compound Examples For example, N-vinylcarbazole, N-vinylpyrrolidone, N-vinylindole, N-vinylindole, N-vinylpyrrole, N-vinylphenothiazine, N-vinylacetoanilide, N-vinylethylacetoamide, N-vinylsuccinimide, N-vinylphthalimide, N-caprolactam, and N-vinylimidazole The content of cationically polymerizable compounds described above in a cationically polymerizable composition is preferably from 1 to 97 percent by weight, and is more preferably from 30 to 95 percent by weight.

(Hybrid Photocurable Resinous Layer)

When a hybrid type (a radically polymerizable type and a cationically polymerizable type are employed in combination) is employed, Japanese Patent Publication Open to Public Inspection No. 4-181944 discloses such compositions. Specifically, any of the aforesaid cationic initiators, cationically polymerizable compounds, radical initiators, and radically polymerizable compounds may be incorporated. Particularly, in the case of the present invention, it is preferable to employ vinyl ether based compounds as the cationically polymerizable compounds.

(Other Additives to the Photocurable Resinous Layer)

When the photosensitive composition of the present invention is blended with various types of sensitizers, it is possible to prepare a very high speed polymerizable composition which is sensitive to radiation ranging from the ultraviolet region to the infrared region. Listed as specific examples of the sensitizers as described in the present invention are unsaturated ketones represented by chalcone derivatives as well as dibenzalacetone, 1,2-diketone derivatives represented by benzyl as well as camphaquinone, polymethine dyes such as benzoin derivatives, fluorene derivatives, naphthoquinone derivatives, xanthene derivatives, thioxanthane derivatives, xanthone derivatives, thioxanthone derivatives, coumarin derivatives, ketocoumarin derivatives, cyanine derivatives, styryl derivatives, merocyanine derivatives, and oxonol derivatives; acridine derivatives, azine derivatives, thiazine derivatives, oxazine derivatives, indoline derivatives, azulene derivatives, azulenium derivatives, squarylium derivatives, porphyrin derivatives, tetraphenylpryphyrin derivatives, triarylmethane derivatives, tetrabenzoporphyrin derivatives, tertapyrazinoporphyrazine derivatives, phthalocyanine derivatives, tetraazaporphyrazine derivatives, tetrakinoxyalyloporphyrazine derivatives, naphthalocyanine derivatives, subphthalocyanine derivatives, pyrylium derivatives, thiopyrilium derivatives, tetraphyrin derivarives, anulene derivatives, spiropyran derivatives, spirooxazoine derivatives, thiospiropyran derivatives, metal allene complexes, and organic ruthenium complexes. In addition, listed as more specific examples of these are dyes and sensitizers described in "Shikiso Handbook (Handbook of Dyes)", edited by Shin Ohkawara et al. (1986, Kohdansha), "Kinohseishikiso no Kagaku (Chemistry of Functional Dyes)", edited by Shin Ohkawara et al. (1981, CMC), "Tokyshu Kinohzairyo (Special Functional Materials)", edited by Chuhzaburo Ikemori et al. (1986, CMC), and Japanese Patent Application No. 7-108045. However, said dyes and sensitizers are not limited to these. Other than these, listed are dyes which absorb radiation ranging from the ultraviolet region to the infrared region. These may be employed in combination of at least two types at an optional ratio.

<Polymerization Accelerators, Chain Transfer Agents, and Agents>

Polymerization accelerator and chain transfer catalysts may be added to the photosensitive composition of the invention. Listed as specific examples of these are, for example, amines such as N-phenylglycine, triethanolamine and N,N-diethylaniline, thiols described in U.S. Pat. No. 4,414,312 and Japanese Patent Publication Open to Public Inspection No. 64-13144, disulfides described in Japanese Patent Publication Open to Public Inspection No. 2-291561, thiones described in U.S. Pat. No. 3,558,322 and Japanese Patent Publication Open to Public Inspection No. 64-17048, and o-acylthiohydroxamate and N-alkoxypyridinethiones described in Japanese Patent Publication Open to Public Inspection No. 2-291560.

<Polymerization Inhibitors>

Polymerization inhibitors can be incorporated in the composition, containing a radically polymerizable compound, for preparing a photocurable resin, in order to prevent polymerization during storage of the solution. Examples of a thermal-polymerization inhibitor, which may be added to the radically polymerizable composition, include p-methoxy phenol, hydroquinone, alkyl substituted hydroquinone, catechol, t-butyl catechol, and phenothiazine. These thermal polymerization inhibitors preferably added in the range of 0.001 to 5.000 parts by weight based on 100 parts by weight of the radically polymerizable compound having an ethylenic unsaturated bond.

<Antistatic Agents>

Listed as antistatic agents are, in addition to cationic surfactants, anionic surfactants, nonionic surfactants, polymeric surfactants and electric conductive fine particles, compounds described in "11290 no Kagaku Shoh-hin (11290 Chemical Products)" pages 875 through 876, published by Kagaku Kogyo Nippoh Co.

<Surfactants>

As surfactants, added can be nonionic surfactants described in Japanese Patent Publication Open to Public Inspection Nos. 62-251740 and 3-208514, or amphoteric surfactants described in Japanese Patent Publication Open to Public Inspection Nos. 59-121044 and 4-13149.

Further, listed may be surfactants such as silicone oil, silicone/alkylene oxide copolymers (for example, L-5410 available on the market from Union Carbide Co.), silicone based surfactants such as produced by Nippon-Unicar Co., silicon oil containing aliphatic epoxides and Si based monoepoxides containing silicon. Si based additives described in "Shin Silicone to Sono Ohoyoh (New Silicones and Their Applications", published by Toshiba Silicone Co. in 1994, and "Tokushu Silicone Shiyaku Catalogue (Catalogue of Specialty Silicone Reagents)" published by Azumax Co. in 1996 may also be used. The addition amount is preferably from 0.001 to 1.000 percent by weight.

<Resins>

Used can be polyvinyl butyral resins, polyurethane resins, polyamide resins, polyester resins, epoxy resins, novolak resins; vinyl monomers of styrene, paramethyl styrene, methacrylate esters and acrylate esters; cellulose based, thermoplastic polyesters, natural resins and combinations with any other high polymers. Further, organic polymers known in the art, described in "Shin Kankohsei Jushi no Jissai Gijutsu (New Practical Technology of Photosensitive Resins)" (by CMC Co., 1987), edited by Kiyoshi Akamatsu, and "10188 no Kagaku Shoh-hin (10188 Chemical Products)" pages 657 through 767 (by Nikkan Kogyo Nippoh Co., 1988) may also be used in combination.

In the present invention, resins having an unsaturated group are specifically preferred, which are characterized in containing a group of being polymerized employing radicals or acids. The unsaturated group, as described herein, refers to a glycidyl group, an acryloyl group, a methacryloyl group, or a vinyl group. The content of these polymers in the photosensitive composition is preferably in the range of 1 to 70 percent by weight, and is more preferably in the range of 5 to 50 percent by weight.

<Coating Solvents>In the present invention, coating solvents are not limited. Said coating solvents to be employed are detailed in "Yozai Handbook (Solvents Handbook)", published by Kohdan Sha. These organic solvents may be employed without any particular limitation.

Further, depending on the intended purposes, the photosensitive composition of the present invention may be employed upon being mixed with dyes, organic and inorganic pigments, oxygen eliminators such as phosphines, phosphonates and phosphites, reducing agents, antifoggants, anti-fading agents, antihalation agents, optical brightening agents, coloring agents, volume increasing agents, plasticizers, non-flammable agents, antioxidants, UV absorbers, foaming agents, mildewcides, magnetic materials, additives providing other various characteristics, and dilution solvents.

(Method for Forming Thermocurable or Photocurable Resinous Layer)

Preparation Method of Thermocurable or Photocurable Resinous Layer

It is preferable that a thermocurable or photocurable resinous layer be formed on an image recording material, employing a coating method or a transfer foil.

When coating is selected as a method to protect the surface of an image recording material, conventional methods known in the art may be employed, which include, for example, a rotation coating method, a wire bar coating method, a dip coating method, a felt coating method, an air-knife coating method, a spray coating method, an air-spray coating method, a static charge air-spray coating method, a roll coating method, a blade coating method, and a curtain-flow coating method. The coating amount in this case varies depending on the intended use, but is preferably, for example, from 0.05 to 50.00 $g/m^2$ as solids. Incidentally, as the coating amount decreases, the apparent sensitivity increases. However, the film characteristics and chemical resistance of the image forming layer is thereby degraded.

As a method to cure the layer after coating, any method, which generates active electromagnetic waves, may be employed. For example, listed may be lasers, light emitting diodes, xenon flash lamps, halogen lamps, carbon arc lamps, metal halide lamps, tungsten lamps, mercury lamps and non-electrode light sources. Preferably listed as light sources are xenon lamps, halogen lamps, carbon arc lamps, metal halide lamps, tungsten lamps, and mercury lamps. Applied energy during curing may be determined by adjusting the exposure distance, time and intensity, based on the kind of polymerization initiators.

(Actinic Curing Radiations)

When lasers are employed as a beam source, it is easy to decrease an exposed area to a minute size, and thus it becomes possible to form images with high resolution. Suitably employed as laser beam sources may be any of the argon laser, He—Ne gas laser, YAG laser, and semiconductor laser.

Further, when photocuring is carried out employing actinic radiation, any appropriate means to stabilize the photocuring under reduced pressure or in a stream of nitrogen may be utilized.

(Thermal Treatment)

Thermal energy can be also provided during curing, and means such as ovens, heat rolls, hot stamps, thermal heads, laser lights, infrared flashes and thermal pens may be suitably selected and utilized.

A protective layer comprised of a thermocurable or photocurable resinous layer of the present invention can be formed by preparing, in advance, a transparent protective layer ribbon or a transparent protective foil which has been formed by coating on a heat resistant support such as a polyethylene terephthalate resin film, and then thermally transferring this, for example, by use of a thermal head and a thermal transfer roll.

<General Description of Image Forming Methods of Image Forming Body>

In the image forming body which is the IC card of the present invention, image elements are provided. At least one selected from identification images such as portrait images, attribute information images and a format printing is formed on said image on the provided base body or the printing surface.

Portrait images, which are generally full-colored gradation images, are prepared employing, for example, a sublimation thermal transfer recording method or a silver halide color photographic method. Text information images, comprised of binary images are is formed employing, for example, a fusion thermal transfer recording method, a sublimation thermal transfer recording method, a silver halide color photographic method, electrophotographic method, or an ink-jet printing method. In the present invention, it is preferable to record identification discrimination images such as portrait images and an attribute information images, employing a sublimation thermal transfer recording method.

Attribute information includes names, addresses, birth date, and licenses, and are usually recorded as text information, while generally utilizing a fusion thermal transfer recording method. Format printing or information recording may also be employed, and this can be formed by any method such as offset printing, gravure printing, silk printing, screen printing, intaglio printing, letterpress printing, an ink-jet printing method, a sublimation transfer method, an electrophotographic method and a thermal fusion method.

Further, in order to thwart forgery and falsification, holograms as well as fine structure tint are acceptable. For preparing said forgery and falsification thwarting layer, printed matters, holograms, bar codes, matted patterns, fine structure tints, ground tints, and irregularity patterns may be are selected as suitable. Said layer is comprised of visible light absorbing colorants, ultraviolet radiation absorbing materials, infrared radiation absorbing materials, optical brightening materials, a metal evaporated layer, a glass evaporated layer, a bead layer, an optical variable device layer, a pearl ink layer, and a scale pigment layer.

<Method for Forming Sublimation Images>

A sublimation thermal transfer recording ink sheet may comprise a support having thereon an ink layer containing sublimation dyes.

-Supports-

Supports are not particularly limited, and those known in the art may be employed, as long as they exhibit desired dimensional stability and are heat resistant during recording with a thermal head.

-Sublimation Dye Containing Ink Layer-

The aforesaid sublimation dye containing ink layer basically comprises sublimation dyes and binders.

Listed as the aforesaid sublimation dyes may be cyan dyes, magenta dyes, and yellow dyes.

Cyan dyes include naphthoquinone based dyes, anthraquinone based dyes and azomethine based dyes, described in Japanese Patent Publication Open to Public Inspection Nos. 59-78896, 59-227948, 60-24966, 60-53563, 60-130735, 60-131292, 60-239289, 61-19396, 61-22993, 61-31292, 61-31467, 61-35994, 61-49893, 61-148269, 62-191191, 63-91288, 63-91287, and 63-290793.

The aforesaid magenta dyes include anthraquinone based dyes, azo dyes and azomethine based dyes, described in Japanese Patent Publication Open to Public Inspection Nos. 59-78896, 60-30392, 60-30394, 60-253595, 61-262190, 63-5992, 63-205288, 64-159, and 64-63194.

The aforesaid yellow dyes include methine based dyes, azo based dyes, quinophthalone based dyes and anthraisothiazole based dyes, described in Japanese Patent Publication Open to Public Inspection Nos. 59-78896, 60-27594, 60-31560, 60-53565, 61-12394, and 63-122594.

Further, specifically preferable sublimation dyes are azomethine dyes obtained by coupling reaction of compounds having an active closed-chain type or open-chain type methylene group, with oxidized products of p-phenylenediamine derivatives or those of p-aminophenol derivatives; and indoaniline dyes obtained by coupling reaction of phenol or naphthol derivatives with oxidized products of p-phenylenediamine derivatives or those of p-aminophenol derivatives.

Further, when a metal ion containing compound is included in an image receptive layer, it is preferable to include a sublimation dye, which forms a chelate with the metal ion containing compound, in a sublimation dye including ink layer. Examples of the chelate forming sublimation dyes include cyan dyes, magenta dyes and yellow dyes, forming a chelate of at least bidentate, described in Japanese Patent Publication Open to Public Inspection Nos. 59-78893, 59-109349, 4-94974, 4-97894, and 4-89292.

Preferable sublimation dyes capable of forming a chelate are represented by General Formula described below:

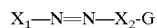

wherein $X_1$ represents an aromatic carbon ring, in which at least one ring is composed of 5 to 7 atoms, or an atomic group necessary to complete a heterocyclic ring, and at least one of the adjacent carbon atoms which bond to the azo bond is a carbon atom substituted by a nitrogen atom or a chelating group; $X_2$ represents a heterocyclic ring, in which at least one ring is composed of 5 to 7 atoms, or an aromatic carbon ring; and G represents a chelating group.

Any sublimation dyes contained in the sublimation dye containing ink layer, described above, may be any of a yellow dye, a magenta dye, or a cyan dye when images to be formed are monochromatic, and any two dyes of the three dyes described above or other sublimation dyes may be incorporated depending on the color of the image to be formed. The used amount of sublimation dyes described above generally ranges from 0.1 to 20 g, and preferably 0.2 to 5 g, based on 1 $m^2$ of support.

Binders for an ink layer are not particularly limited, and ant of those known in the art may be used. Further, in the aforementioned ink layer, any of the various kinds of additives well known in the art may be suitably added.

An ink sheet for sublimation thermal transfer recording can be prepared by preparing an ink layer forming coating solution, which is prepared by dispersing or dissolving the various ink layer forming components described above, coating the solution on a surface of a support and drying it. The thickness of an ink layer thus prepared is commonly from 0.2 to 10.0 μm, and is preferably from 0.3 to 3.0 μm.

Figure 13:
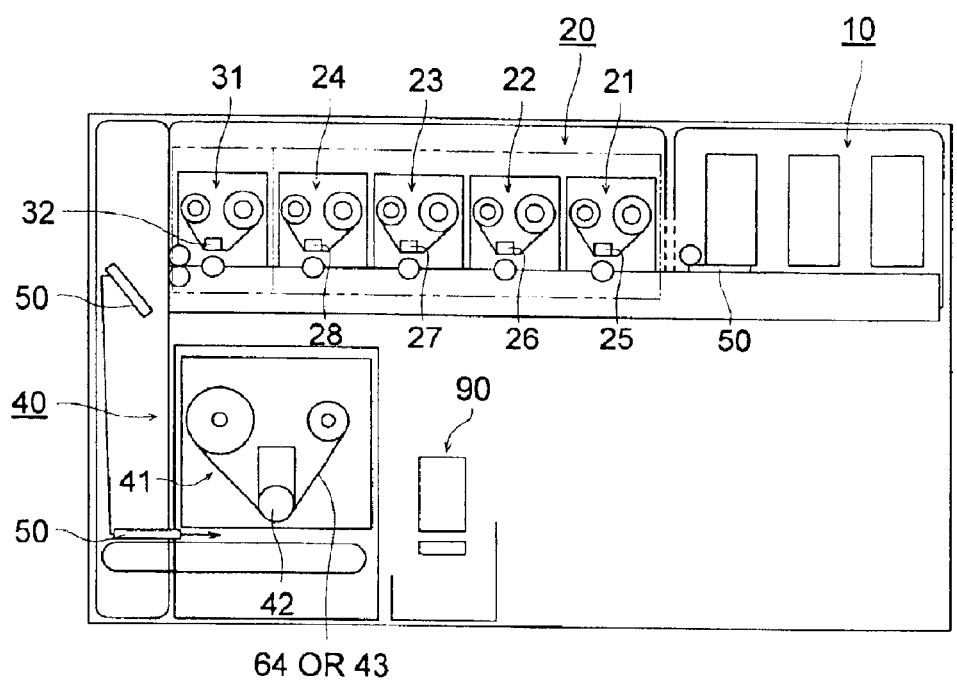
FIG. 13 is a schematic view showing the structure of an image recording medium preparation apparatus.
Figure 14:
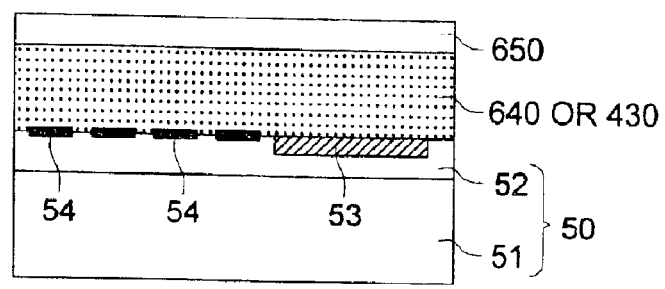
FIG. 14 is a view showing the layer configuration of an image recording medium.

The embodiments of the method for forming an image recording body, which is comprised of the transfer foil as well as the IC card of the present invention, will now be described with reference to drawings. However, the present invention is not limited to the description and drawings of these embodiments. First, FIGS. 13 and 14 show the first embodiment. FIG. 13 is a schematic view showing the structure of an image recording body preparation apparatus, and FIG. 14 is a view showing the layer configuration of the image recording body.

In the image recording body preparation apparatus of this embodiment, card base material supplying section 10 and information recording section 20 are arranged in the upper position, while protection providing section and/or optical variable device providing section 40, and actinic light curable layer providing section and/or actinic light exposure section 90 are arranged in the lower position. Thus, it is possible to prepare cards as well as sheets as an image recording body.

In said card base material supplying section 10, a plurality of card base materials 50, which have been cut into sheets for writing personal information of the card bearer, is stored so that the portrait recording surface faces upward. In this example, card base material 50 comprises support 51 having thereon image receptive layer 52. Each of said card base materials 50 is automatically fed from card base material supplying section 10 at specified timing.

In information recording section 20, yellow ribbon cassette 21, magenta ribbon cassette 22, cyan ribbon cassette 23, and black ribbon cassette 24 are arranged, and printing heads 25 through 28 are arranged corresponding to each of the cassettes. In the specified region of said image receptive layer 52, image region 53 comprised of images having gradation, such as the portrait of the card bearer, is recorded. Further, text ribbon cassette 31 and printing head 32 are arranged and identification information 54 such as the bearer's name and the card issue date is recorded, whereby an image recording layer is formed.

Transfer foil cassette 41 is arranged in protection providing and/or optical variable device providing section 40, and thermal transfer head 42 is arranged corresponding to said transfer foil cassette 41. Transparent protection transfer foil 64 and/or optical variable device transfer foil 43 is thermally transferred and provided is transparent protection transfer layer 640 and/or optical variable device transfer layer 430.

Thereafter, an actinic radiation curable composition is coated employing actinic radiation curable layer providing section and/or actinic radiation exposure section 90. Exposure is then carried out employing actinic radiation. The layer configuration of the image recording body as shown in FIG. 13 is produced, and actinic radiation curable layer 650 is provided on transparent protection transfer layer 640 and/or optical variable device transfer layer 430.

Figure 15:
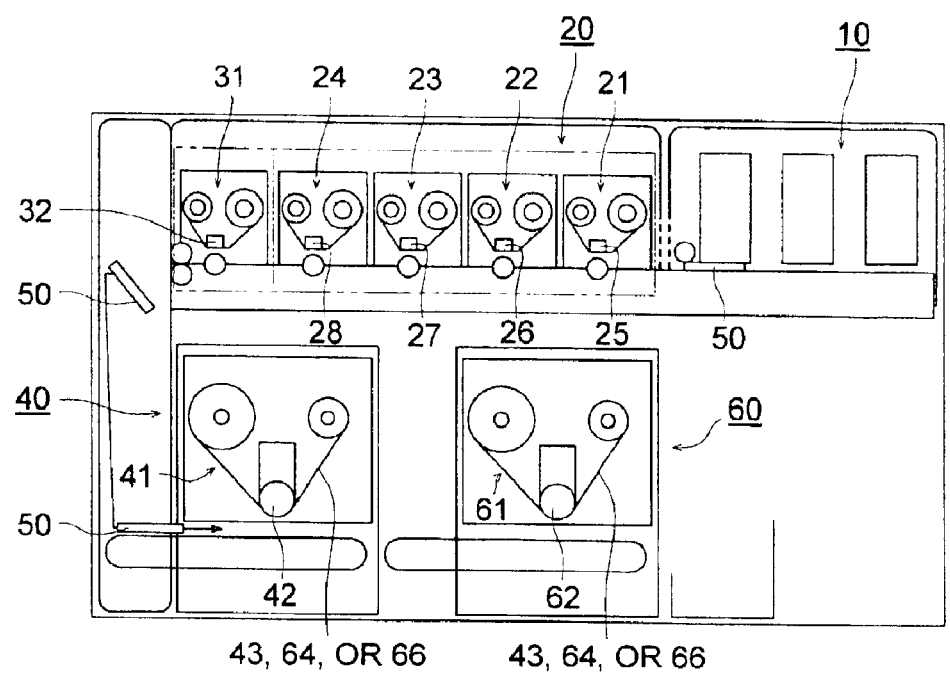
FIG. 15 is a schematic view showing the structure of another image recording medium.
Figure 16:
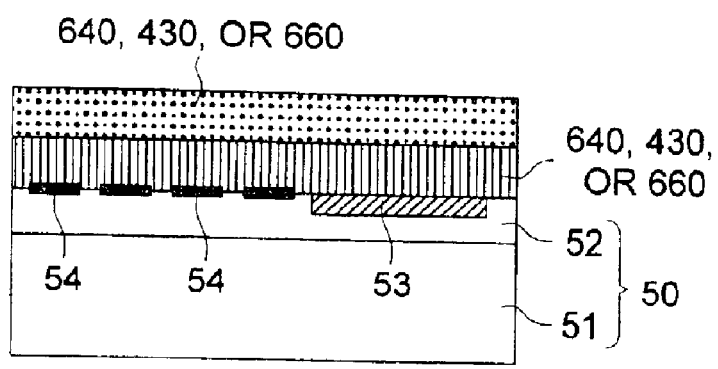
FIG. 16 is a view showing the layer configuration of still another image recording medium.

FIGS. 15 and 16 show the second embodiment. FIG. 15 is a schematic view showing the structure of an image recording body preparation apparatus, while FIG. 16 is a view of the layer configuration of said image recording body.

In the image recording body preparation apparatus having said embodiment, card base material supplying section 10 and information recording section 20 are constituted in the same manner. However, said information recording section 20 is initially arranged. Subsequently, protection providing section and/or optical variable device providing section 40 and resin providing section 60 are arranged.

Transparent protection transfer layer 640 and/or optical variable device transfer layer 430 is arranged in protection providing section and/or optical variable device providing section 40. In resin providing section 60, curable protection layer containing transfer layer 660 is provided by thermally transferring curable transfer foil 66 onto the image recording body which has been formed on image receptive layer 52, employing transparent protection transfer layer 640 and/or optical variable device transfer layer 430.

Figure 17:
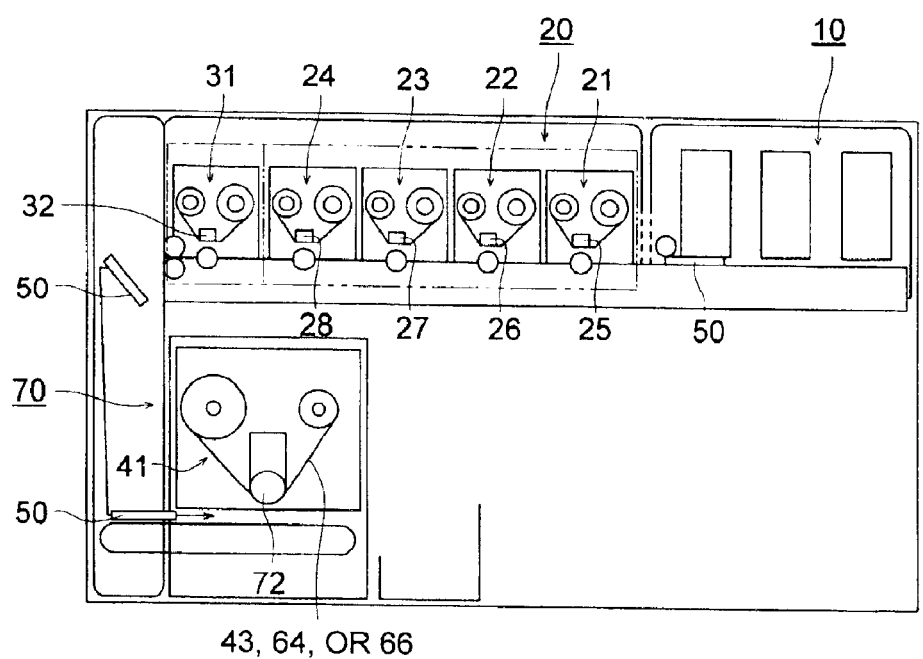
FIG. 17 is a schematic view showing the structure of an image recording medium preparation apparatus.
Figure 18:
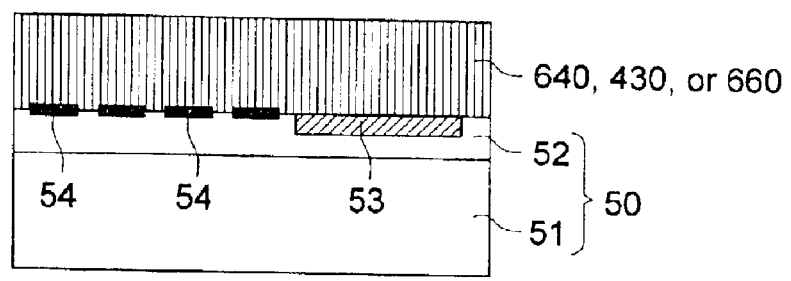
FIG. 18 is a view showing the layer configuration of an image recording medium.

FIGS. 17 and 18 show the third embodiment. FIG. 17 is a schematic view showing the structure of an image recording body preparation apparatus, while FIG. 18 is a view showing the layer configuration of said image recording body.

In the image recording body preparation apparatus having said embodiment, card base material supplying section 10 and information recording section 20 are constituted in the same manner. However, transparent protective layer and/or optical variable device providing section/or resinous layer providing section 70 are arranged.

Transfer foil cassette 71 is arranged in transparent protective layer and/or optical variable device transfer providing section/or resinous layer providing section 70, and thermal transfer head 72 is arranged corresponding to said transfer foil cassette 71.

The transparent protective transfer foil, as described in the present invention, refers to a transparent protective foil which protects images, while the transparent protective layer, as described in the present invention, refers to a transparent protective layer which protects images. Further, the actinic radiation curable resinous layer, as described herein, refers to one type of a resinous layer which is a preferable embodiment in the present invention. As shown in FIGS. 1 and 2, said layer is occasionally limited to a resinous layer depending on its production. Further, the curable protective layer containing optical variable device layer, as descried herein, refers to a layer in which a curable layer is integrated with an optical variable device layer. Still further, the protection providing transfer foil, as described herein, refers to a transfer foil comprising at least one resinous layer (preferably comprised of actinic radiation curable resins).

Figure 19:
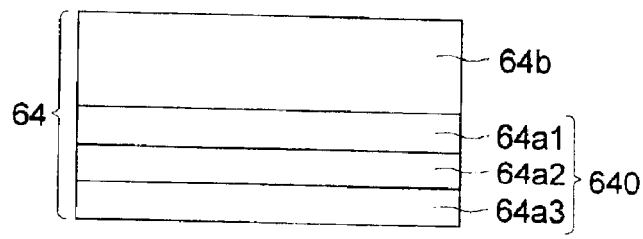
FIG. 19 is a view showing the embodiment of a transparent protective transfer foil.
Figure 19:
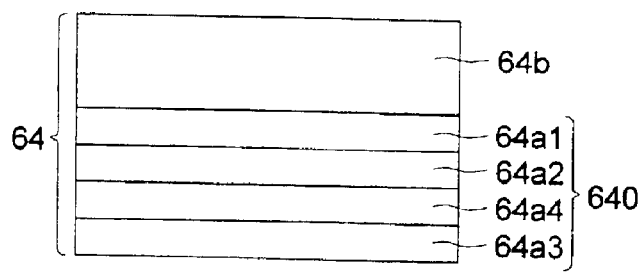
Figure 19:
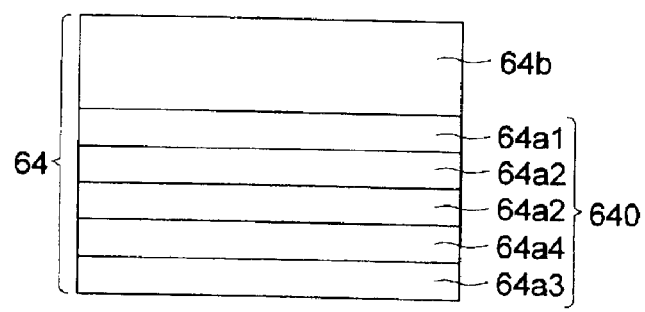
Figure 19:
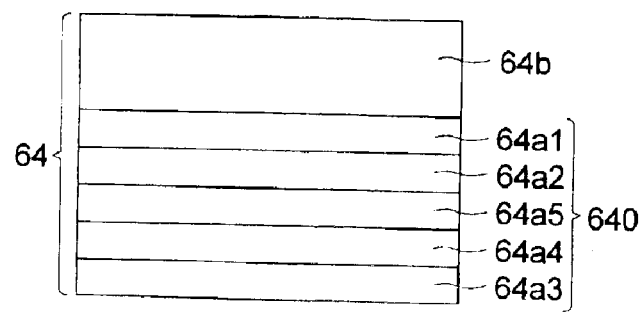

FIGS. 19(*a*) through 19(*d*) show embodiments of transparent protective transfer foil 64. Transparent protective transfer foil 64, shown in FIG. 19(*a*), comprises support 64*b* having thereon transparent protective transfer layer 640, in which transparent protective transfer layer 640 is comprised of mold releasing layer 64*a*1, transparent protective layer 64*a*2, and adhesive layer 64*a*3, said releasing layer 64*a*1 and said adhesive layer 64*a*3 being provided on both sides of said transparent protective layer 64*a*2, and said mold-releasing layer 64*a*1 being adhered to said support 64*b*. Transparent protective transfer foil 64 shown in FIG. 19(*b*) is structured in the same manner as said transfer foil shown in FIG. 19(*a*), however, intermediate layer 64*a*4 is provided between said transparent protective layer 64*a*2 and said adhesive layer 64*a*3. Transparent protective transfer foil 64, shown in FIG. 19(*c*), is structured in the same manner as said transfer foil in FIG. 19(*b*), however, two transparent protective layers 64*a*2 are provided. Transparent protective transfer foil 64 in FIG. 19(*d*) is structured in the same manner as said transfer foil in FIG. 19(*b*), however, barrier layer 64*a*5 is provided between said transparent protective layer 64*a*2 and said intermediate layer 64*a*4.

Said transparent protective transfer foil 64 is transferred while transparent protective transfer layer 640 is peeled from support 43*b*.

Figure 20:
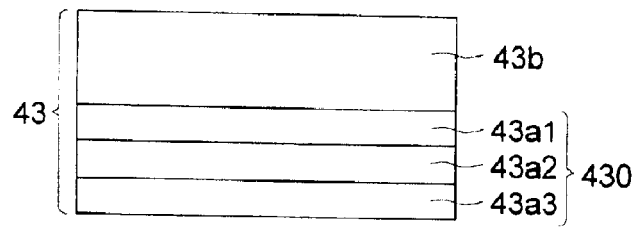
FIG. 20 is a view showing the embodiment of an optical variable device transfer foil.
Figure 20:
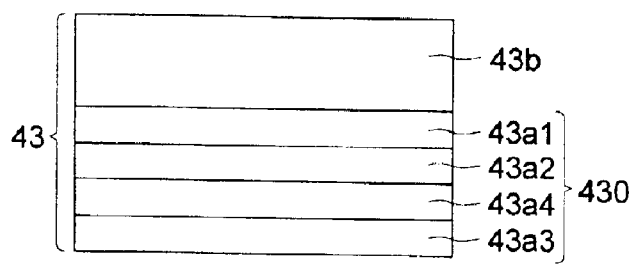
Figure 20:
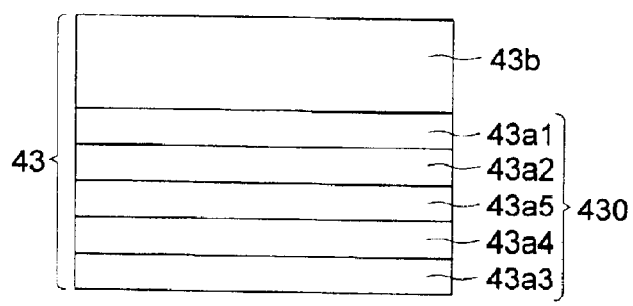
Figure 20:
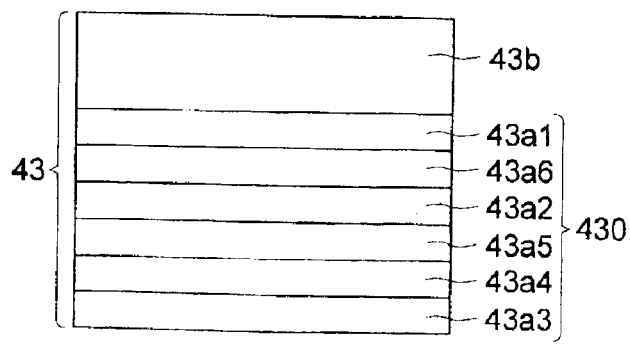

FIGS. 20(*a*) through 20(*d*) show embodiments of optical variable device transfer foil 43. optical variable device transfer foil 43 in FIG. 20(*a*) comprises support 43*b* having thereon optical variable device transfer layer 430 in which said optical variable device transfer layer 430 is composed of mold releasing layer 43*a*1, optical variable device layer 43*a*2 and adhesive layer 43*a*3, said mold-releasing layer 43*a*1 and said adhesive layer 43*a*3 being provided on both sides of said optical variable device layer 43*a*2, and said mold-releasing layer 43*a*1 being adhered to said support 43*b*. Optical variable device transfer foil 43 in FIG. 9(*b*) is structured in the same manner as said transfer foil in FIG. 20(*a*), however, intermediate layer 43*a*4 is provided between said adhesive layer 43*a*3 and said optical variable device layer 43*a*2. Optical variable device transfer foil 43 in FIG. 9(*c*) is structured in the same manner as said transfer foil in FIG. 20(*b*), however, barrier layer 43*a*5 is provided between said optical variable device layer 43*a*2 and said intermediate layer 43*a*4. Transfer foil 43 in FIG. 9(*d*) is structured in the same manner as said transfer foil in FIG. 20(*c*), however, protective layer 43*a*6 is provided between said mold-releasing layer 43*a*1 and said optical variable device layer 43*a*2.

Said optical variable device transfer foil 43 is transferred while optical variable device transfer layer 430 is peeled from support 43b.

Figure 21:
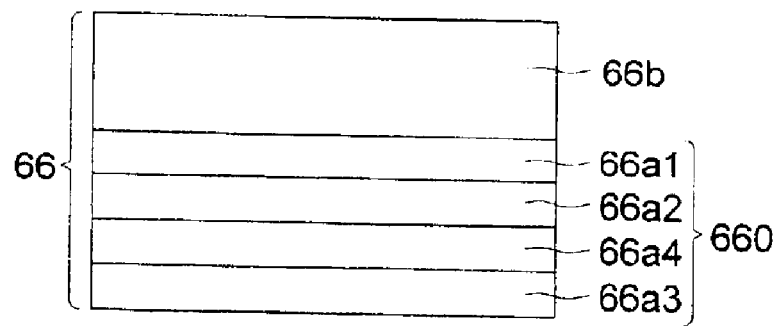
FIG. 21 is a view showing the embodiment of a curable transfer foil.
Figure 21:
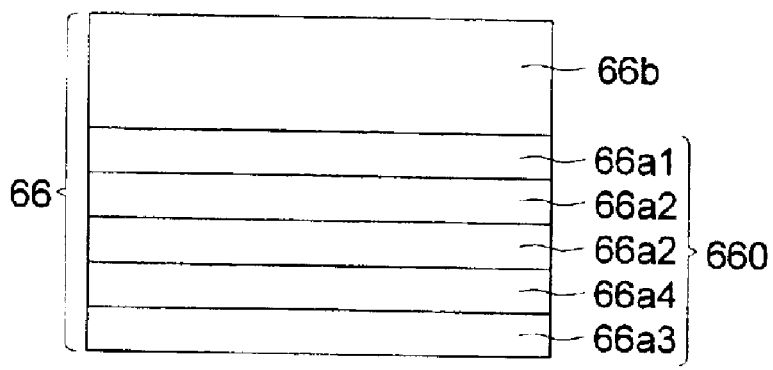
Figure 21:
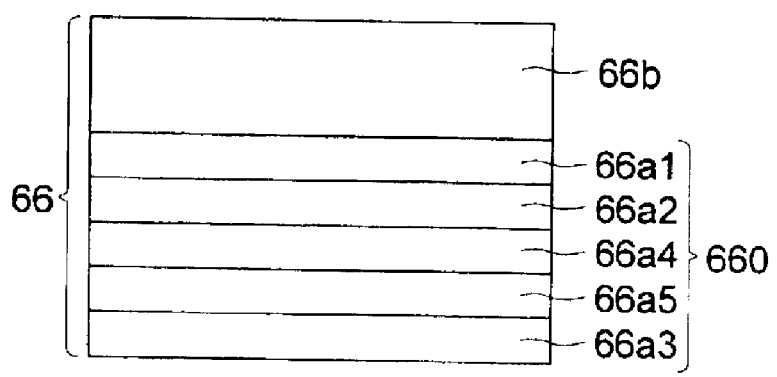

FIGS. 21(a) through 21(c) show embodiments of curable transfer foil 66. Curable transfer foil 66 shown in FIG. 21(a) comprises support 66b having thereon curable protective layer containing transfer layer 660 in which said curable protective layer containing transfer layer 660 is composed of mold releasing layer 66a1, intermediate layer 66a4 and adhesive layer 66a3, said mold-releasing layer 66a1 and said intermediate layer 66a4 being provided on both sides of said curable layer 66a2, and said mold-releasing layer 66a1 being adhered to said support 66b. Curable transfer foil 66 shown in FIG. 10(b) is structured in the same manner as said transfer foil in FIG. 21(a), however, two of said curable layers 66a2 are provided. Curable transfer foil 66 in FIG. 21(c) is structured in the same manner as said transfer foil in FIG. 21(a), however, barrier layer 66a5 is provided between said adhesive layer 66a3 and said intermediate layer 66a4.

Said curable transfer foil 66 is transferred while curable protective layer containing transfer layer 660 is peeled from support 66b.

Figure 22:
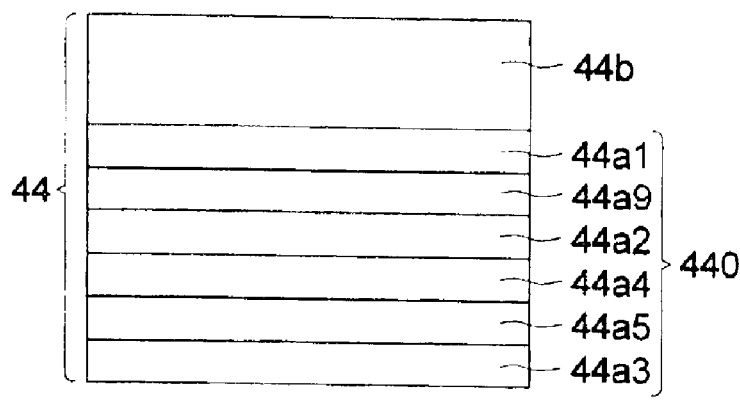
FIG. 22 is a view showing the embodiment of a curable resinous layer comprising an optical variable device transfer foil.
Figure 22:
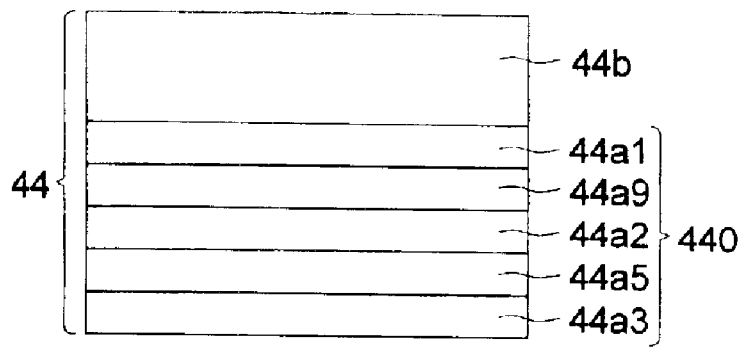
Figure 22:
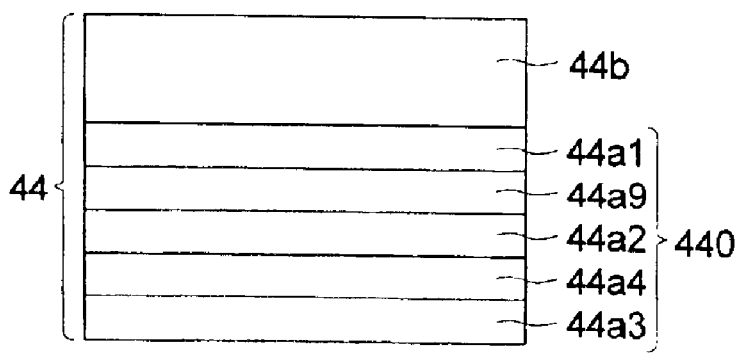

FIGS. 22(a) through 22(c) show embodiments of curable resinous layer containing optical variable device transfer foil 44. Curable resinous layer containing optical variable device transfer foil 44 in FIG. 11(a) comprises support 44b having thereon curable resinous layer containing optical variable device transfer layer 440 and said curable resinous layer containing optical variable device transfer layer 440 is comprised of mold-releasing layer 44a1, curable layer 44a9, optical variable device layer 44a2, intermediate layer 44a4, barrier layer 44a5 and adhesive layer 44a3, and said mold-releasing layer 44a1 is adhered onto said support 44b. Curable resinous layer containing optical variable device transfer foil 44 shown in FIG. 22(b) is structured in the same manner as said transfer foil in FIG. 22(a), however, intermediate layer 44a4 is not provided. Further, curable resinous layer containing optical variable device transfer foil 44 in FIG. 22(c) is structured in the same manner as said transfer foil in FIG. 22(a), however, barrier layer 44a5 is not provided.

Said curable resinous layer containing optical variable device transfer foil 44 is transferred, while curable resinous layer containing optical variable device transfer layer 440 is peeled from transferred to an IC card substrate by being peeled from support 44b.

Curable resinous layer containing optical variable device transfer foils 44 of said embodiment is transferred while curable resinous layer containing optical variable device transfer layers 440 is peeled from support 44b. Said curable resinous layer containing optical variable device transfer layer 440 is comprised of at least a releasing layer, a curable layer, an optical variable device layer, an interlayer, and an adhesion layer, and exhibits excellent surface protection as well as excellent surface abrasion resistance.

Further, it is preferable that the transparent protective layer, which is positioned on the surface side of the image recording body from the optical variable device layer is comprised of either an ultraviolet ray curable layer or an electron beam curable layer, since excellent surface protection as well as excellent surface abrasion resistance is obtained.

Further, it is preferable that the optical variable device layer is a hard-coat layer or an evaporated layer, having irregularity images, since forgery as well as falsification is more effectively thwarted.

Further, it is preferable that at least one transparent protective layer is thermally transferred to the entire surface of the card, since excellent surface protection as well as surface abrasion resistance is achieved.

Still further, it is preferable that antistatic agents are incorporated in either a transparent protective transfer layer or an optical variable device transfer layer, since it is possible to prepare cards or sheets which are resistant to dust adhesion.

Furthermore, it is preferable that the surface of the layer, which has previously been transferred, is subjected to an adhesion enhancement treatment for the transfer foil to follow, since the desired excellent adhesion results.

In the transfer foil of the present invention, at least one each of an antistatic layer, a releasing layer, a transparent protective layer, an optical variable device layer, a barrier layer, an interlayer, or an adhesion layer is preferably provided. The antistatic layer of said transfer foil comprises anionic polymers having excellent antistatic properties and/or electrically conductive particles.

Transfer foil materials employed in the present invention will now be detailed.

The transfer foil of the present invention comprises a support preferably having thereon a releasing layer and a transparent resinous layer, and more preferably having thereon a layer comprised of at least one of a releasing layer, a transparent resinous layer, an interlayer, a barrier layer, a primer layer, or an adhesion layer. In the case of the present invention, it is possible to thwart forgery and falsification, utilizing IC chips. However, for the purpose of visual identification, it is possible to provide an optical variable device layer.

(Supports for Transfer Foil)

Listed as materials for supports are, for example, polyester resins such as polyethylene terephthalate, polybutylene terephthalate, and polyethylene terephthalate/isophthalate copolymers; polyolefin resins such as polyethylene, polypropylene, and polymethylpentane; polyfluoroethylene based resins such as polyvinyl fluoride, polyvinylidene fluoride, polytetrafluoroethylene, and ethylene-ethylenetetrafluoride copolymers; polyamides such as nylon 6 and nylon 6.6; vinyl polymers such as polyvinyl chloride, vinyl chloride/vinyl acetate copolymers, ethylene/vinyl acetate copolymers, ethylene/vinyl alcohol copolymers, polyvinyl alcohol, and vinylon; cellulose based resins such as cellulose triacetate and cellophane; acryl based resins such as ethyl polymethacrylate, ethyl polymethacrylate, ethyl polyacrylate and butyl polyacrylate; polystyrene, polycarbonate, polyallylate and polyimide; paper such as wood free paper, thin leaf paper, glassine paper, sulfuric acid paper; and metal foils; and accumulated sheets comprised of two or more layers thereof. The thickness of supports of the present invention is commonly from 10 to 200 $\mu$m, and is preferably from 15 to 80 $\mu$m. When the thickness is at most 10 $\mu$m, problems occur in which supports are damaged during transfer. In the specified releasing layer of the present invention, polyethylene terephthalate is preferred.

If desired, supports of the present invention may have surface irregularities. Irregularity preparing methods includes compounding of matting agents, sand-blast processing, hair-line processing, matte coating, and chemical etching. In said matte coating, either organic or inorganic substances can be utilized. For example, employed as inorganic substances for matte coating may be silica described in Swiss Patent No. 330,158, glass powder described in French Patent No. 1,296,995, and carbonates of alkaline earth metals or cadmium and zinc described in British Patent No. 1,173,181. Employed as organic substances formatting may be, for example, starch described in U.S. Pat. No. 2,322,037, starch derivatives described in Belgian Patent No. 625,451 and British Patent No. 981,198, polyvinyl alcohol described in Japanese Patent Publication No. 44-3643, polystyrene or polymethacrylate described in Swiss Patent No. 330,158, polyacrylonitrile described in U.S. Pat. No. 3,079,257 and polycarbonate described in U.S. Pat. No. 3,022,169. The method for attaching a matting agent may be one in which matting agents are dispersed in a coating composition in advance and then coated, or one in which, after applying a coating composition and before complete of drying, matting agents are sprayed. Further, when a plurality of types of matting agents is added, both methods may be employed in combination. When the irregularity surface forming treatment of the present invention is carried out, it can be provided on at least one of the transfer surface as well as the rear surface.

(Transfer Foil Releasing Layer)

Listed as materials employed in said releasing layer are, for example, resins such as acrylic resins having a relatively high glass transition temperature, polyvinyl acetal resins, and polyvinyl butyral resins, waxes, silicone oils, fluorine compounds, and resins such as water-soluble polyvinyl pyrrolidone resins, polyvinyl alcohol resins, Si-modified polyvinyl alcohols, methyl cellulose resins, hydroxy cellulose resins, and silicone resins, paraffin wax, acryl-modified silicone, polyethylene wax and ethylene vinyl acetate, and in addition, polydimethylsiloxane and modified compounds thereof, including oils and resins such as polyester-modified silicone, acryl-modified silicone, urethane-modified silicone, alkyd-modified silicone, epoxy-modified silicone, and polyether-modified silicone and cured compounds thereof. Listed as other fluorine based compounds are fluorinated olefins and perfluorophosphoric acid ester based compounds. Listed as preferable olefin based compounds are dispersions of polyethylene and polypropylene, and long-chained alkyl based compounds such as polyethyleneimine octadecyl. Said releasing agents having low solubility may be employed upon being dispersed.

When two transfer foils are transferred, thermoplastic elastomers may be added. Listed as specific examples of thermoplastic elastomers are styrene based (styrene block copolymer (SBC)), olefin based (TP), urethane based (TPU), polyester based (TPEE), polyamide based (TPAE), 1,2-polybutadiene based, vinyl chloride based (TPVC), fluorine based, ionomer resins, chlorinated polyethylene, and silicone. Specific compounds are described in "12996 no Kagaku Shoh-hin (12996 Chemical Products)" (Kagaku Kogyo Nippoh Co.).

The thermoplastic elastomers having a tensile elongation of at least 100 percent, used suitably in the invention, which is comprised of a block polymer of polystyrene and polyolefin, refer to thermoplastic resins (hereinafter also referred to as thermoplastic resin SI) comprised of blocks of styrene and saturated straight or branched chain alkyl having at most 10 carbon atoms. Specifically, listed as said thermoplastic elastomers are block polymers, having a polystyrene phase and a hydrogenated polyolefin phase, such as block polymers of styrene-butadiene-styrene (SBS), styrene-isoprene-styrene (SIS), styrene-ethylene/butylene-styrene (SEBS), styrene-ethylene/propylene-styrene (SEPS) and styrene-ethylene/propylene (SEP).

Further, if desired, a thermocurable resinous layer may be used between the releasing layer of the present invention and the resinous layer or the actinic radiation curable layer. Specifically, listed are polyester resins, acrylic resins, epoxy resins, xylene resins, guanamine resins, diallylphthalate resins, phenol resins, polyimide resins, maleic acid resins, melamine resins, urea resins, polyamide resins, and urethane resins.

A transparent resinous layer of the transfer foil may be comprised while combined with polyvinyl butyral resins, polyurethane resins, polyamide resins, polyester resins, epoxy resins and novolak resins, vinyl monomers such as styrene, paramethylstyrene, methacrylic acid esters and acrylate esters, cellulose series, thermoplastic polyesters, natural resins and any other polymers. Further, organic polymers known in the art which are described in "Shin Kankohsei Jushi no Jissai Gijutsu (New Practical Technology of Photosensitive Resins)", edited by Kiyoshi Akamatsu (CMC, 1987), and "10188 no Kagaku Shoh-hin (10188 Chemical Products)" pages 657 through 767 (by Kagaku Kogyo Nippoh Co., 1988) may also be used in combination.

In the present invention, it is preferable for the purpose of protecting the surface of the image recording body that a photocurable or thermocurable resinous layer be provided employing a transfer foil. Said photocurable or thermocurable layer is not particularly limited, as long as its materials are comprised of the composition as previously described. The thickness of said transparent resinous layer is preferably from 0.3 to 50.0 μm, is more preferably from 0.3 to 30.0 μm, and is most preferably from 0.3 to 20.0 μm.

The interlayer of the transfer foil is preferably comprised of at least one interlayer. However, if desired, adhesion between layers may be enhanced by additionally providing a primer layer and a barrier layer.

For example, employed may be vinyl chloride based resins, polyester based resins, acryl based resins, polyvinyl acetal based resins, polyvinyl butyral based resins, polyvinyl alcohols, polycarbonates, cellulose based resins, styrene based resins, urethane based resins, amide based resins, urea based resins, epoxy resins, phenoxy resins, polycaprolactone resins, polyacrylonitrile resins, SEBS resins, SEPS resins, and modified compounds thereof.

Of the aforesaid resins, those, which are preferably employed in the present invention, include vinyl chloride based resins, polyester based resins, acryl based resins, polyvinyl butyral based resins, styrene based resins, epoxy resins, urethane based resins, urethane acrylate resins, SEBS resins and SEPS resins. These resins may be employed individually or in combination of at least two types.

Specific compounds are preferably thermoplastic resins comprised of a block polymer of polystyrene and polyolefin, and polyvinyl butyral. Polyvinyl butyral resins having a degree of polymerization of at least 1,000, used in the intermediate layer, which are commercially available, include Eslec BH-3, BX-1, BX-2, BX-5, BX-55, and BH-S, manufactured by Sekisui Kagaku Kogyo Co., Ltd., and Denka Butyral #4000-2, #5000-A, and #6000-EP, manufactured by Denki Kagaku Kogyo Co., Ltd. The degree of polymerization of polybutyral before thermal curing, as a thermocurable resin in the interlayer, is not limited. Said polybutyral may be resins having a low degree of polymerization. Isocyanate curing agents as well as epoxy curing agents may be employed for thermal curing. Preferable thermal curing conditions are such that the temperature is from 50 to 90° C. and the duration is from 1 to 24 hours. The thickness of said interlayer is preferably from 0.1 to 1.0 μm.

<Thermo-Adhesive Resins>

Listed as thermo-adhesive resins employed in the adhesive layer of the transfer foil are ethylene vinyl acetate resins, ethylene acrylate acid resins, ethylene acrylic acid resins, ionomer resins, polybutadiene resins, acryl resins, polystyrene resins, polyester resins, olefin resins, urethane resins, adhesion providing agent (such as phenol resins, rosin resins, terpene resins, and petroleum resins). Further, copolymers and mixtures thereof may be employed.

Urethane modified ethylene acrylate copolymers, which are specifically available on the market, include Hightech S-6254, S-6254B, and S-3129, produced by Toho Kagaku Kogyo Co., Ltd. Polyacrylic acid ester copolymers, which are available on the market, include Jurimer AT-210, AT-510, and AT-613, produced by Nippon Junyaku Co., Ltd., as well as Plussize L-201, SR102, SR-103, and J-4, produced by Go-oh Kagaku Kogyo Co., Ltd. The weight ratio of urethane modified ethylene acrylate copolymers to polyacrylic acid ester copolymers is preferably from 9:1 to 2:8, and the thickness of said adhesive layer is preferably from 0.1 to 1.0 $\mu$m.

In certain cases, it is possible to provide an optical variable device layer transfer layer to thwart forgery and falsification. The optical variable device, as described herein, refers to 1) a two-dimensional CG image of diffraction grating such as a kinegram, characterized in that an image composed of a line image varies by free movement by transfer, rotation, expansion, and contraction, 2) a pixelgram characterized in that an image varies between the positive and the negative, 3) an OSD (Optical Security Device) in which color changes from gold to green, 4) an LEDV (Long Lasting Economical Anticopy Device) in which an image is viewed to be different, 5) a stripe type OVD, and 6) a metal foil in which security may be maintained by employing sheet components, specific printing techniques, and specific inks, described in Nihon Insatsu Gakkai Shi (Japanese Printing Association Bulletin), Vol.35, No.6, pages 482 through 496 (1998). In the present invention, holograms are particularly preferred.

Optionally employed as holograms used in the present invention may be any of those selected from laser reproduction holograms such as a relief hologram, a Fresnel hologram, a Fraunhofer hologram, a lens-less Fourier transformation hologram and image hologram, a white reproduction hologram such as a Lippmann hologram and a rainbow hologram, a color hologram, a computer hologram, a hologram display, a multiflex hologram, a hologramflex stereogram, and a holographic diffraction grating.

For example, it is possible to form said optical variable device layer by adhering a hologram sheet onto an image receptive layer. As said hologram sheet, it is possible to use a relief type hologram sheet. Said relief type hologram sheet comprises a film support having thereon a hologram forming layer and a hologram effectuating layer which are laminated in said order. Said hologram sheet can be prepared as follows. For example, a heat molding resinous layer which is solid at normal temperature, such as a thermoplastic electron beam curable resinous layer (a hologram forming layer) which is solid at normal temperature is formed on a support film such as a polyethylene terephthalate film. Subsequently, a hologram original plate having a holographic interference pattern in the form of an irregular surface, being pressed thereon to transfer the irregularity pattern onto the resinous surface, and then being cured; and further forming a thin hologram effectuating layer, composed of a material having sufficient transparency as well as much reflectability at a certain angle and a refractive index different from that of the hologram forming layer (for example, an evaporated film of $TiO_2$, $SiO_2$ or ZnS) on the roughened surface. The hologram, which reproduces images employing white light such as daylight and illumination light, is superior in decorative function because hologram images are visible under ordinary conditions. On the other hand, the hologram, in which images are reproduced by a laser beam, is superior in detection of forgery.

Further, in the present invention, it is possible to provide a bead bearing layer. The bead holding layer, having beads according to the present invention, reconstitutes the incident light by adding a phase difference to a part of the incident light, emphasizes a light component of a specific wavelength region by interference to return colored light having a color different from that of said incident light to the incoming direction of the incident light, and comprises a reflection substrate and transparent beads regularly placed thereon. The bead holding layer comprising beads is composed of a reflection substrate provided with a resinous layer thereon, and many beads, made of material such as glass and having a bead diameter of 10 to 60 $\mu$m, preferably of 15 to 40 $\mu$m, regularly placed, on the surface side thereof. The refractive index of light of the bead is preferably 1.6 to 2.1, and more preferably 1.7 to 2.0. The incoming incident light proceeds into the bead, at least a part of said incident light being reflected by the reflection substrate through the transparent bead and resinous layer, returns to the bead again and proceeds to outside. Because the surface of the bead facing the outside is spherical, similar function is effected regardless of some variation of the incident angle and the reflected light can be returned to the incoming direction.

In the present invention, subsequently, it is possible to provide a reflection layer. The reflection layer according to the present invention is selected from at least a metal thin layer, a metal oxide thin layer, a light interference material, and a light diffraction layer. It is preferable that said reflection layer is provided with an optional tint pattern which is printed with a paint comprising a powder such as interference substances, metal oxides, and mica, which are capable of resulting in an interference color.

Listed as metal oxides are titanium dioxide, iron oxide, titanium lower-order oxide, zirconium oxide, silicon oxide, aluminum oxide, cobalt oxide, nickel oxide and cobalt titanate, composite oxides such as $Li_2CoTi_3O_8$ and $KNiTiO_x$ and mixtures thereof. However, metal oxides are not particularly limited as long as they exhibit interference color. As an interference material layer, a metal film, exhibiting an interference color obtained by oxidizing the surface thereof, can be used. Methods to prepare these metal films include a method in which a film of aluminum, titanium and stainless steel is subjected to anodic oxidation, a method in which a metal oxide capable of exhibiting an interference color is prepared by a sol-gel method and coated, a method in which metal alkoxide capable of exhibiting an interference color is coated on a metal film and thermally decomposed, and an evaporation processing method such as a CVD and a PVD.
(Method for Providing a Transfer Foil onto an Image Recording Body)

The transfer foil is transferred onto a transfer receptive material employing means such as a thermal head, a heat roller, or a hot stamp machine, which are capable of simultaneously heating and pressing.

The image recording body, and the production apparatus as well as the production method thereof, as an embodiment of the present invention, will now be described with reference to drawings.

Incidentally, the thickens of the base material of the IC card of the present invention is not particularly limited, but is preferably from 100 to 1,200 $\mu$m, is more preferably from 200 to 1,000 $\mu$m, and is still more preferably from 200 to 900 $\mu$m. The thickness of the IC card prepared employing the IC card base material is not particularly limited, but is preferably from 200 to 1,500 μm, is more preferably from 250 to 1,200 μm, and is still more preferably from 300 to 1,000 μm.

<IC Card Base Material and IC Card Preparation Method>

Figure 29:
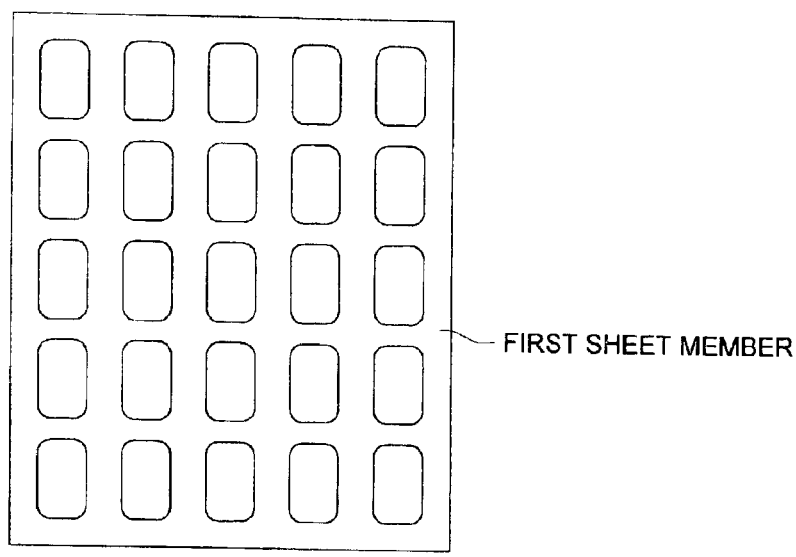
FIG. 29 is a perspective view of a front sheet or a rear sheet used in an IC card base material preparation apparatus.
Figure 29:
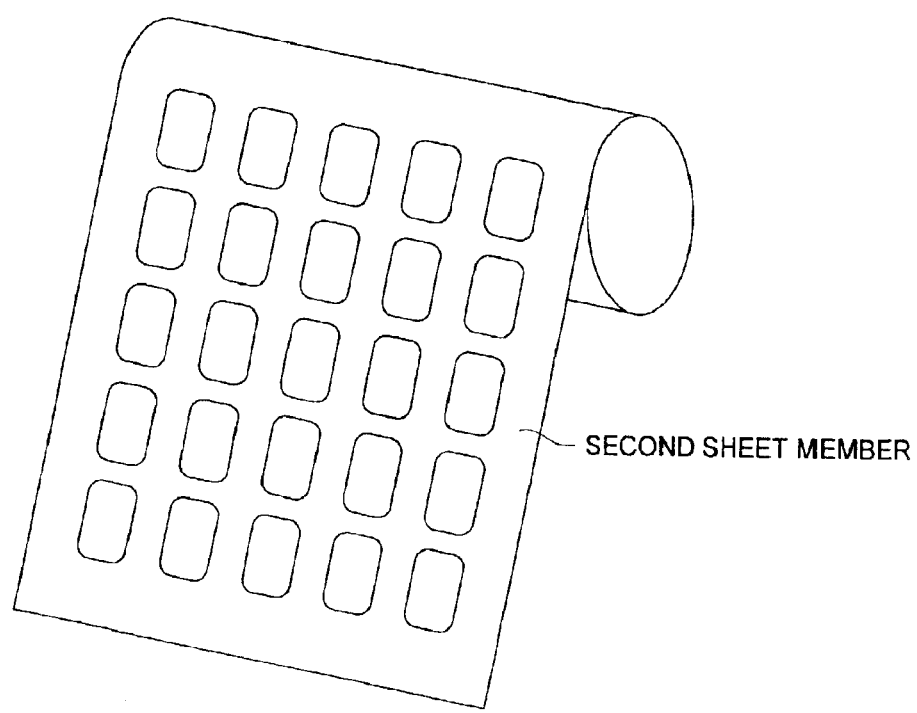

FIGS. 23(a) through 23(c) show the first embodiment of a front sheet. FIG. 23(a) is a cross-sectional view of said front sheet; FIG. 23(b) is a front view of said front sheet; and FIG. 23(c) is a perspective view showing the constitution of the IC card employing said front sheet. As shown in FIG. 23(a), the card base material of the front sheet comprises a base material having thereon a cushioning layer, an image receptive layer, an information bearing layer, and a transparent resinous layer which are laminated in said order, in which images are formed on said image receptive layer. Two scale pigment layers are laminated on said information bearing layer, and transparent resinous layers are also laminated thereon. Further, an IC chip hiding part is provided on the side opposite the image receptive layer of the base material. As shown in FIG. 23(b), said information bearing body layer displays employee identification and a name. IC card 9, shown in FIG. 23(c), is prepared employing an IC card base material preparing sheet which consists of a group of said IC cards as shown in FIG. 29(a).

FIGS. 24(a) through 24(c) show the second embodiment of a front sheet. FIG. 24(a) is a cross-sectional view of said front sheet, FIG. 24(b) is a front view of said front sheet, and FIG. 24(c) is a perspective view showing the constitution of the IC card employing said front sheet. As shown in FIG. 24(a), the card base material of the front sheet comprises a base material having thereon a cushioning layer, an image receptive layer, an information bearing layer, and a transparent resinous layer which are laminated in said order, in which images are formed on said image receptive layer. As shown in FIG. 24(b), said information bearing body layer displays employee identification and a name.

FIGS. 25(a) and 25(b) show the first embodiments of a rear sheet. FIG. 25(a) is a cross-sectional view of said rear sheet, and FIG. 25(b) is a front surface view of said rear sheet. As shown in FIG. 25(a), the card base material of said rear sheet comprises a base material having thereon a writing layer and an information bearing body layer, which are laminated in said order. Further, an IC chip hiding part is provided on the opposite side of the writing layer of the base material.

As shown in FIG. 25(b), the information bearing body on said writing layer expresses ruled lines, the name of a card issuing company, and remarks. IC cards are prepared employing an IC card base material preparing sheet which consists of a group of said IC cards as shown in FIG. 29(b).

FIGS. 26(a) and 26(b) show the second embodiment of a rear sheet. FIG. 26(a) is a cross-sectional view of said rear sheet, and FIG. 25(b) is a front surface view of said rear sheet. As shown in FIG. 26(a), the card base material of said rear sheet comprises a base material having thereon a writing layer and an information bearing body layer, which are laminated in said order. As shown in FIG. 26(b), the information bearing body on said writing layer displays ruled lines, a card issuing company, the name of the card issuing company, and remarks. IC cards are prepared employing an IC card base material preparing sheet which consists of a group of said IC cards as shown in FIG. 29(b).

The IC card base material preparation apparatus, as an embodiment, will now be described.

Figure 27:
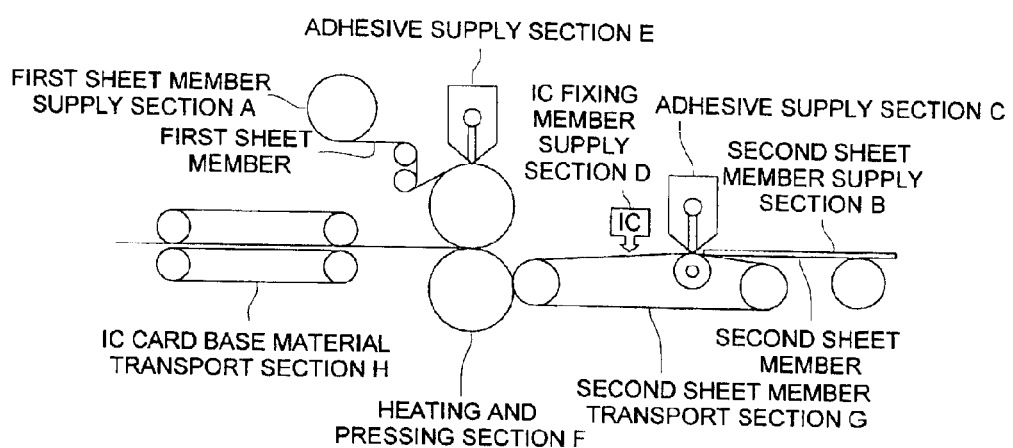
FIG. 27 is a schematic view showing the structure of an IC card base material preparation apparatus.

FIG. 27 is a schematic view showing the constitution of an IC card base material preparation apparatus. In said IC card base material preparation apparatus, a first sheet member (a rear sheet) of a long sheet having a thickness of 100 μm is arranged in first sheet member supply section A, while a second sheet member (a front sheet) of a long sheet having a thickness of 100 μm is arranged in second sheet member supply section B. An adhesive is supplied onto said second sheet member from adhesive supply section C, and materials for electronic parts of the present invention are arranged onto said second sheet member from IC fixing member supply section D. Said adhesive is supplied onto said first sheet member from adhesive supply section E, and the resultant first sheet member is conveyed to pressing and heating section F.

Said second sheet member is conveyed to pressing and heating section F, employing second sheet member transport section G. In said pressing and heating section F, materials for IC cards are interposed between said first sheet member and said second sheet member so as to be adhered, whereby an IC card base material original block is prepared. It is preferable that said IC card base material original block is subjected to curing of the adhesive in IC card transport section H so that close adhesion with the support is achieved which is then subjected to final cutting. The resultant IC card base material original block is cut employing a rotary cutter, whereby it is possible to prepare a 55×85 mm IC card base material.

Figure 28:
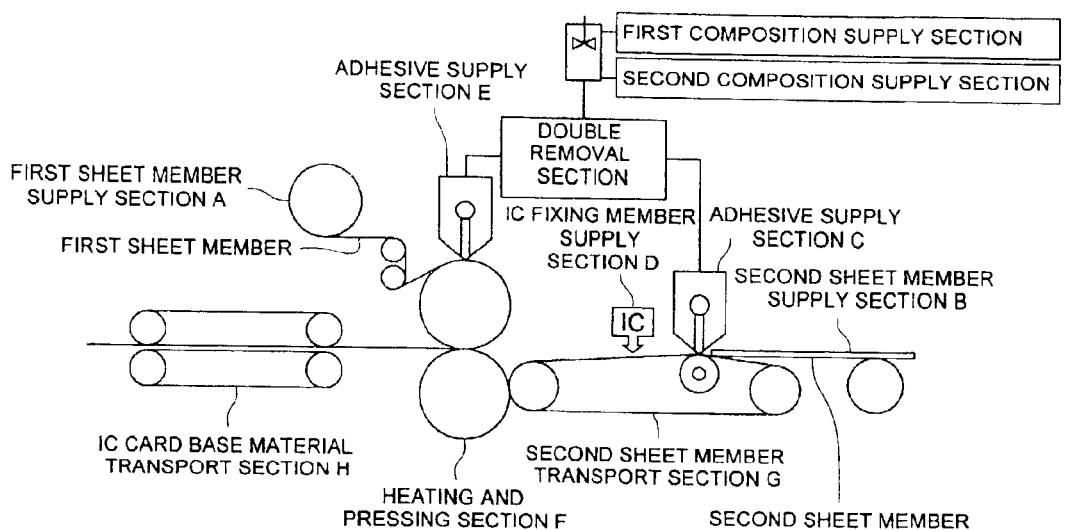
FIG. 28 is a schematic view showing the structure of another embodiment of an IC card base material preparation apparatus.

FIG. 28 is a schematic view showing the constitution of another embodiment of an IC card base material preparation apparatus. In said IC card base material preparation apparatus, a first sheet member (a rear sheet) of a long sheet having a thickness of 100 μm is arranged in first sheet member supply section A, while a second sheet member (a front sheet) of a long sheet having a thickness of 100 μm is arranged in second sheet member supply section B. An adhesive is supplied onto said second sheet member from adhesive supply section C, and materials for electronic parts of the present invention are arranged onto said second sheet member from IC fixing member supply section D. An adhesive is supplied onto said first sheet member from adhesive supply section E, and the resultant first sheet member is conveyed to pressing and heating section F.

An adhesive is supplied to adhesive supply section C as well as adhesive supply section E as follows. A first composition supplied from a first composition supply section and a second composition supplied from a second composition supply section are mixed in a mixing section and the resultant mixture is subjected to debubbling. Subsequently the resultant adhesive is supplied as described above.

The second sheet member is conveyed to pressing and heating section F by second sheet member transport section G. In said pressing and heating section F, IC card materials are interposed between the first sheet member and the second sheet member and adhered employing a heating or pressure (at a pressure of 3 kg/cm$^2$) roller, whereby an IC card base material original block is prepared. It is preferable that the resultant IC card base material original block is subjected to curing of the adhesive in IC card transport section H so that close adhesion with the support is achieved which is then subjected to final cutting. The resultant IC card base material original block is cut employing a rotary cutter, whereby it is possible to prepare a 55×85 mm IC card base material.

Figure 26:
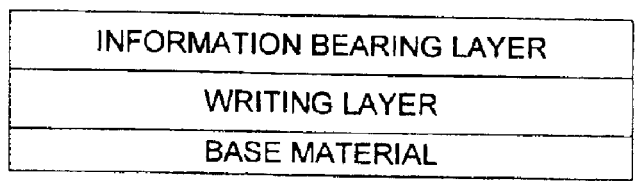
FIG. 26 is a view showing the second embodiment of a rear sheet.
Figure 26:
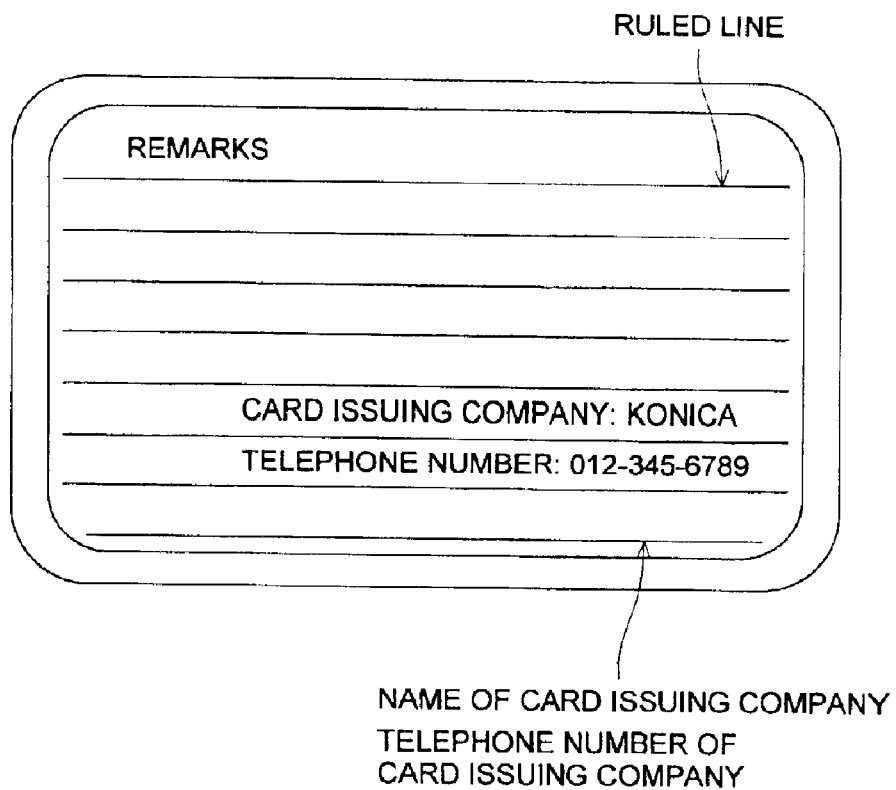

FIGS. 29(a) and 29(b) are perspective views of the front sheet and the rear sheet employed in the IC card base material preparation apparatus shown in FIGS. 26 and 27.

EXAMPLES

The present invention will now be detailed with reference to examples. However, the embodiments of the present invention are not limited to these examples. Incidentally, in the examples described below, "part(s)" are "part(s) by weight".

<Preparation of First Sheet Member (Rear Sheet 1)>

Employed as a front sheet and a rear sheet was 100 μm low heat absorptive U2L90 W-100, manufactured by Teijin Dupont Film Co., Ltd.

(Preparation of Writing Layer)

A first writing layer forming coating composition, a second writing layer forming coating composition, and a third writing layer forming coating composition having compositions described below were applied onto said 100 μm rear sheet support in said order and subsequently dried. The coating thickness of the resultant writing layer was adjusted to 5 μm, 15 μm, and 0.2 μm, respectively.

| <First Writing Layer Forming Coating Composition> | |
|---|---|
| Polyester resin (Biron 200, manufactured by Toyobo Co., Ltd.) | 8 parts |
| Isocyanate (Coronate HX, manufactured by Nippon Polyurethane Kogyo Co., Ltd.) | 1 part |
| Carbon black | minute amount |
| Titanium dioxide particles (CR80, manufactured by Ishihara Sangyo Co., Ltd.) | 1 part |
| Methyl ethyl ketone | 80 parts |
| Butyl acetate | 10 parts |
| <Second Writing Layer Forming Coating Composition> | |
| Polyester resin (Bironal MD1200, manufactured by Toyo Boyobo Co., Ltd.) | 4 parts |
| Silica | 5 parts |
| Titanium dioxide particles (CR80, manufactured by Ishihara Sangyo Co., Ltd.) | 1 part |
| Water | 90 parts |
| <Third Writing Layer Forming Coating Composition> | |
| Polyamide resin (Sanmide 55, manufactured by Sanwa Kagaku Kogyo Co., Ltd.) | 5 parts |
| Methanol | 95 parts |

The center line mean roughness of the resultant writing layer was 1.34 μm.

(Formation of a Format Printing Layer onto the Writing Layer)

Format printing (ruled lines, name of a card issuing company, and telephone number of the card issuing company) was carried out by an offset printing method. Employed as printing ink was a UV black ink. During printing, UV exposure was carried out employing a high pressure mercury lamp at an intensity equivalent to 200 mJ.

(Preparation of IC Chip Hiding Part)

The outermost surface of the support on the opposite side of the writing layer was subjected to water-mark printing employing a wash-off resin relief printing method. The printed pattern shown in either FIG. 7 or 8 was employed. Table 1 shows the employed pattern. Printing was carried out employing UV black ink. During printing, UV exposure was carried out employing a high pressure mercury lamp at an intensity equivalent to 200 mJ. The layer thickness was 1.0 μm.

<Preparation of First Sheet Member (Rear Sheet 2)>

Employed as a front sheet and a rear sheet was 100 μm low heat absorptive U2L98 W-100, manufactured by Teijin Dupont Film Co., Ltd.

(Preparation of Writing Layer)

A first writing layer forming coating composition, a second writing layer forming coating composition, and a third writing layer forming coating composition having compositions described below were applied onto said 100 μm rear sheet support in said order, and subsequently dried. The coating thickness of each of the resultant writing layers was adjusted to 5 μm, 15 μm, and 0.2 μm, respectively.

| <First Writing Layer Forming Coating Composition> | |
|---|---|
| Polyester resin (Biron 200, manufactured by Toyobo Co., Ltd.) | 8 parts |
| Isocyanate (Coronate HX, manufactured by Nippon Polyurethane Kogyo Co., Ltd.) | 1 part |
| Carbon black | minute amount |
| Titanium dioxide particles (CR80, manufactured by Ishihara Sangyo Co., Ltd.) | 1 part |
| Methyl ethyl ketone | 80 parts |
| Butyl acetate | 10 parts |
| <Second Writing Layer Forming Coating Composition> | |
| Polyester resin (Bironal MD1200, manufactured by Toyobo Co., Ltd.) | 4 parts |
| Silica | 5 parts |
| Titanium dioxide particles (CR80, manufactured by Ishihara Sangyo Co., Ltd.) | 1 part |
| Water | 90 parts |
| <Third Writing Layer Forming Coating Composition> | |
| Polyamide resin (Sanmide 55, manufactured by Sanwa Kagaku Kogyo Co., Ltd.) | 5 parts |
| Methanol | 95 parts |

The center line mean roughness of the resultant writing layer was 1.34 μm.

(Formation of a Format Printing Layer onto the Writing Layer)

Format printing (ruled lines, name of a card issuing company, and telephone number of the card issuing company) was carried out employing offset printing method. Employed as printing ink was UV black ink. During printing, UV exposure was carried out employing a high pressure mercury lamp at an intensity equivalent to 200 mJ.

(Preparation Front Sheet 1)

A cushioning layer and an image receptive layer comprised of the compositions described below were successively applied onto the aforesaid 100 μm support first sheet and subsequently dried, whereby a second sheet member (Front Sheet 1) was formed.

| (Photocurable Cushioning Layer) Layer thickness of 10 μm | |
|---|---|
| Urethane acrylate oligomer (NK Oligo UA512, manufactured by Shin Nakamura Kagaku Co.) | 55 parts |
| Polyester acrylate (Aronics M6200, manufactured by Toagosei Co. Ltd.) | 15 parts |
| Urethane acrylate oligomer (NK Oligo UA4000, manufactured by Shin Nakamura Kagaku Co.) | 25 parts |
| Hydoxycyclohexyl phenyl ketone (Irugacure 184, manufactured by Ciba Specialty Chemicals) | 5 parts |
| Methyl ethyl ketone | 100 parts |

After coating, the actinic radiation curable compounds were dried at 90° C. for 30 seconds and were subjected to photocuring, employing a mercury lamp (300 mJ/cm$^2$).

(Image Receptive Layer)

A first image receptive layer forming coating composition, a second image receptive layer forming coating composition, and a third image receptive layer forming coating composition were successively applied onto the aforesaid cushioning layer in said order, and dried. Said multilayer coating was carried out to obtain a coating thickness of 0.2 μm, 2.5 μm, and 0.5 μm, respectively, and an image receptive layer was formed.

| <First Image Receptive Layer Forming Coating Composition> | |
|---|---|
| Polyvinyl butyral resin (Eslec BL-1, manufactured by Sekisui Kagaku Kogyo Co., Ltd.) | 9 parts |
| Isocyanate (Coronate HX, manufactured by Nippon Polyurethane Kogyo Co., Ltd.) | 1 part |
| Methyl ethyl ketone | 80 parts |
| Butyl acetate | 10 parts |
| <Second Image Receptive Layer Forming Coating Composition> | |
| Polyvinyl butyral resin (Eslec BX-1, manufactured by Sekisui Kagaku Kogyo Co., Ltd.) | 6 parts |
| Metal ion containing compound (Compound MS) | 4 parts |
| Methyl ethyl ketone | 80 parts |
| Butyl acetate | 10 parts |
| <Third Image Receptive Layer Forming Coating Composition> | |
| Polyethylene wax (Hightech E1000, manufactured by Toho Kagaku Kogyo Co., Ltd.) | 2 parts |
| Urethane modified ethylene acrylic acid copolymer (Hightech S6254, manufactured by Toho Kagaku Kogyo Co., Ltd.) | 8 parts |
| Methyl cellulose (SM15, Manufactured by Shin-Etsu Kagaku Kogyo Co., Ltd.) | 0.1 part |
| Water | 90 parts |

(Formation of Information Bearing Body Comprised of a Format Printing Layer)

Format printing (employee identification and name) was carried out on the image receptive layer employing an offset printing method. Employed as printing ink was a UV black ink. During printing, UV exposure was carried out employing a high pressure mercury lamp at an intensity equivalent to 200 mJ.

(Formation of Transparent Resinous Layer)

The composition described below was mixed employing a roller mill, whereby printing ink was prepared. Printing was carried out employing an offset printing method. During printing, UV exposure was carried out employing a high pressure mercury lamp at an intensity equivalent to 200 mJ.

| (Transparent Resinous Layer Composition 1) | |
|---|---|
| Urethane acrylate oligomer | 50 parts |
| Aliphatic polyester acrylate oligomer | 35 parts |
| Dirocure 1173 manufactured by Ciba Specialty Chemicals Co.) | 5 parts |
| Trimethylolpropane acrylate | 10 parts |

(Preparation of IC Chip Hiding Part)

The outermost surface of the support on the opposite side of the image receptive layer was subjected to water-mark printing employing a wash-off resin relief printing method. The printed pattern shown in either FIG. 7 or 8 was employed. Table 1 shows the employed pattern. Printing was carried out employing a UV black ink. During printing, UV exposure was carried out employing a high pressure mercury lamp at an intensity equivalent to 200 mJ. The layer thickness was 1.0 μm.

(Formation of a Scale Pigment Layer Forming Layer)

Printing ink comprised of the composition described below was mixed employing the method described in the table, whereby printing ink was prepared. Printing was carried out employing an offset printing method. A printing ink layer was prepared under continuous printing, employing offset printing so as to be laminated as shown in a view showing the constitution of the image recoding body layer. The layer thickness was 38 μm.

During printing, UV exposure was carried out employing a high pressure mercury lamp at an intensity equivalent to 200 mJ.

| (Scale Pigment Layer Composition 1) | |
|---|---|
| Iriodin 211 (manufactured by Merck Co.) | 45 parts |
| Urethane acrylate oligomer | 40 parts |
| Dirocure 173 (manufactured by Ciba Specialty Chemicals Co.) | 5 parts |
| Trimethylolpropane acrylate | 10 parts |

<Preparation of Second Sheet Member (Front Sheet 2)>

Employed as a front sheet and a rear sheet was U2L98 W100, low heat absorptive grade, manufactured by Teijin Dupont Film Co., Ltd.

(Preparation of Front Sheet 2)

A cushioning layer and an image receptive layer, comprised of the compositions described below, were successively applied onto the aforesaid 100 μm support front sheet and subsequently dried, whereby a second sheet member (Front Sheet 1) was formed.

| (Photocurable Cushioning Layer) Layer thickness of 10 μm | |
|---|---|
| Urethane acrylate oligomer (NK Oligo UA512, manufactured by Shin Nakamura Kagaku Co.) | 55 parts |
| Polyester acrylate (Aronics M6200, manufactured by Toagosei Co.) | 15 parts |
| Urethane acrylate oligomer (NK Oligo UA4000, manufactured by Shin Nakamura Kagaku Co.) | 25 parts |
| Hydoxycyclohexyl phenyl ketone (Irugacure 184, manufactured by Ciba Specialty Chemicals) | 5 parts |
| Methyl ethyl ketone | 100 parts |

After coating, the actinic radiation curable compounds were dried at 90° C. for 30 seconds and were subjected to photocuring employing a mercury lamp (300 mJ/cm$^2$).

(Image Receptive Layer)

A first image receptive layer forming coating composition, a second image receptive layer forming coating composition, and a third image receptive layer forming coating composition were successively applied onto the aforesaid cushioning layer in said order, and dried. Said multilayer coating was carried out to obtain a coating thickness of 0.2 μm, 2.5 μm, and 0.5 μm, respectively, whereby an image receptive layer was formed.

| <First Image Receptive Layer Forming Coating Composition> | |
|---|---|
| Polyvinyl butyral resin (Eslec BL-1, manufactured by Sekisui Kagaku Kogyo Co., Ltd.) | 9 parts |

-continued

| | |
|---|---|
| Isocyanate (Coronate HX, manufactured by Nippon Polyurethane Kogyo Co., Ltd.) | 1 part |
| Methyl ethyl ketone | 80 parts |
| Butyl acetate | 10 parts |
| <Second Image Receptive Layer Forming Coating Composition> | |
| Polyvinyl butyral resin (Eslec BX-1, manufactured by Sekisui Kagaku Kogyo Co., Ltd.) | 6 parts |
| Metal ion containing compound (Compound MS) | 4 parts |
| Methyl ethyl ketone | 80 parts |
| Butyl acetate | 10 parts |
| <Third Image Receptive Layer Forming Coating Composition> | |
| Polyethylene wax (Hightech E1000, manufactured by Toho Kagaku Kogyo Co., Ltd.) | 2 parts |
| Urethane modified ethylene acrylic acid copolymer (Hightech S6254, manufactured by Toho Kagaku Kogyo Co., Ltd.) | 8 parts |
| Methyl cellulose (SM15, manufactured by Shin-Etsu Kagaku Kogyo Co., Ltd.) | 0.1 part |
| Water | 90 parts |

(Formation of the Information Bearing Body Comprised of a Format Printing Layer)

Format printing (employee identification and name) was carried out on the image receptive layer employing an offset printing method. Employed as printing ink was UV black ink. During printing, UV exposure was carried out employing a high pressure mercury lamp at an intensity equivalent to 200 mJ.

(Formation of Transparent Resinous Layer)

The composition described below was mixed employing a roll mill, whereby printing ink was prepared. Printing was carried out employing an offset printing method. During printing, UV exposure was carried out employing a high pressure mercury lamp at an intensity equivalent to 200 mJ.

| (Transparent Resinous Layer Composition 1) | |
|---|---|
| Urethane acrylate oligomer | 50 parts |
| Aliphatic polyester acrylate oligomer | 35 parts |
| Dilocure 1173 manufactured by Ciba Specialty Chemicals Co.) | 5 parts |
| Trimethylolpropane acrylate | 10 parts |

<Preparation of Image Recording Body for IC Card>

The second sheet member prepared, as above, was employed. The first sheet member (the rear sheet) was placed at the first sheet supply section and the second sheet was placed at the second sheet supply section in the apparatus which prepared IC mounted card base materials and the image receptive layer provided IC card base materials. Macroplast QR3460, manufactured by Henkel Corp., was charged into the hot melt agent supply section and then applied onto the first or the second sheet member, whereby a 550 μm image recording body for IC cards was prepared.

After confirming the curing of adhesives, the resultant sheet was subjected to final cutting, employing a die cutter, whereby a 55×85 mm image recording body for IC cards was prepared.

Table 1 shows the card evaluation results. Examples 1 through 19 exhibited improved smoothness, durability, and IC chip identification, compared to Comparative Examples 1 through 4.

(Preparation Method of IC Card)

Method for Describing an Identification Image and Attribute Information onto an IC Card (Preparation of Ink Sheet for Sublimation Type Thermal Transfer Recording)

Each of a yellow ink layer forming coating composition, a magenta ink layer forming coating composition, and a cyan ink layer forming coating composition, having the compositions described below, was applied onto a 6 μm polyethylene terephthalate sheet, of which rear surface had been subjected to a fusion resistant treatment, so as to obtain a thickness of 1 μm, whereby three color ink sheets of yellow, magenta, and cyan were prepared.

| <Yellow Ink Layer Forming Coating Composition> | |
|---|---|
| Yellow dye (MS Yellow, manufactured by Mitsui Tohatsu Senryo Co., Ltd.) | 3 parts |
| Polyvinyl acetal (Denka Butyral KY-24, manufactured by Denki Kagaku Kogyo Co., Ltd.) | 5.5 parts |
| Polymethyl methacrylate modified polystyrene (Rededa GP-200, manufactured by Toa Gosei Kagaku Kogyo Co., Ltd.) | 1 part |
| Urethane modified silicone oil (Diaroma SP-2105, manufactured by Dainichi Seika Kogyo Co., Ltd.) | 0.5 part |
| Methyl ethyl ketone | 70 parts |
| Toluene | 20 parts |
| <Magenta Ink Layer Forming Coating Composition> | |
| Magenta dye (MS Magenta, manufactured by Mitsui Tohatsu Senryo Co., Ltd.) | 2 parts |
| Polyvinyl acetal (Denka Butyral KY-24, manufactured by Denki Kagaku Kogyo Co., Ltd.) | 5.5 parts |
| Polymethyl methacrylate modified polystyrene (Rededa GP-200, manufactured by Toa Gosei Kagaku Kogyo Co., Ltd.) | 2 parts |
| Urethane modified silicone oil (Diaroma SP-2105, manufactured by Dainichi Seika Kogyo Co., Ltd.) | 0.5 part |
| Methyl ethyl ketone | 70 parts |
| Toluene | 20 parts |
| <Cyan Ink Layer Forming Coating Composition> | |
| Cyan dye (Kayaset Blue 136, manufactured by Nihon Kayaku Co., Ltd.) | 3 parts |
| Polyvinyl acetal (Denka Butyral KY-24, manufactured by Denki Kagaku Kogyo Co., Ltd.) | 5.6 parts |
| Polymethyl methacrylate modified polystyrene (Rededa GP-200, manufactured by Toa Gosei Kagaku Kogyo Co., Ltd.) | 1 part |
| Urethane modified silicone oil (Diaroma SP-2105, manufactured by Dainichi Seika Kogyo Co., Ltd.) | 0.5 part |
| Methyl ethyl ketone | 70 parts |
| Toluene | 20 parts |

(Preparation of Fusible Thermal Transfer Recording Ink Sheet)

An ink layer forming coating composition, having the composition described below, was applied onto a 6 μm thick polyethylene terephthalate sheet of which rear surface had been subjected to a fusion resistant treatment so as to obtain a coating thickness of 2 μm, whereby an ink sheet was prepared.

| <Ink Layer Forming Coating Composition> | |
|---|---|
| Carnauba wax | 1 part |
| Ethylene vinyl acetate copolymer EV40Y, manufactured by Mitsui Dupont Chemical Co.) | 1 part |
| Carbon black | 3 parts |
| Phenol resin (Tamanol 521, manufactured by Arakawa Kagaku Kogyo Co., Ltd.) | 5 parts |
| Methyl ethyl ketone | 90 parts |

(Formation of the Portrait Image)

An image receptive layer or a transparent resin section and information printing section was faced with the surface of the ink side of a sublimation thermal transfer recording ink sheet and the ink sheet side was heated employing a thermal head under conditions of an output of 0.23 W/dot, a pulse width of 0.3 to 4.5 m second, and a dot density of 16 dots/mm, whereby a portrait image having gradation was formed. In said image, said dye and nickel in said receptive layer formed a complex.

(Formation of Text Information)

A transparent resin section or a scale pigment containing layer was faced with the surface of the ink side of a fusible thermal transfer recording ink sheet and the ink sheet side was heated employing a thermal head under conditions of an output of 0.5 W/dot, a pulse width of 1.0 m second, and a dot density of 16 dots/mm, whereby text information was formed on the image recording body for IC cards.

As mentioned above, the portrait image and attribute information were provided.

A method for forming a protective layer onto an IC card will now be described.

Synthesis Example 1

Synthesis Example 1 of Resin Added to IC Card Surface Protective Layer

Placed in a three-necked flask were 73 parts of methyl methacrylate, 15 parts of styrene, 12 parts of methacrylic acid, 500 parts of ethanol, and 3 parts of α,α'-azobisisobutylnitrile, and the resultant mixture underwent reaction in an oil bath at 80° C. under a flow of nitrogen for 6 hours. Thereafter, 3 parts of triethylammonium chloride and 1.0 part of glycidyl methacrylate were added and the resultant mixture underwent reaction for 3 hours, whereby target Synthesis Binder 1, comprised of an acryl based copolymer, was prepared.

A coating composition, prepared by employing the formula described below, was applied onto one surface of polyethylene terephthalate (S-25), manufactured by Daifoil Hoechst Co., Ltd. employing wire bar coating, and subsequently dried, whereby Transfer Foils 1 through 3 were formed.

| (Preparation of Transparent Resin Transfer Foil 1) (Releasing Layer) Layer thickness of 0.5 μm | |
|---|---|
| Acryl based resin (Dianal BR-87, manufactured by Mitsubishi Rayon Co., Ltd.) | 5 parts |
| Polyvinyl acetoacetal (having a SP value of 9.4, KS-1, manufactured by Sekisui Kagaku Co., Ltd.) | 5 parts |

-continued

| (Preparation of Transparent Resin Transfer Foil 1) (Releasing Layer) Layer thickness of 0.5 μm | |
|---|---|
| Methyl ethyl ketone | 40 parts |
| Toluene | 50 parts |

After coating, drying was carried out at 90° C. for 30 seconds.

| <Interlayer Forming Coating Composition> Layer thickness of 0.3 μm | |
|---|---|
| Polyvinyl butyral resin (Eslec BX-1, Sekisui Kagaku Co., Ltd.) | 5 parts |
| Toughtex M-1913 (manufactured by Asahi Kasei Co., Ltd.) | 3.5 parts |
| Curing agent polyisocyanate (Coronate HX, manufactured by Nippon Urethane CO., Ltd.) | 1.5 parts |
| Methyl ethyl ketone | 20 parts |
| Toluene | 70 parts |

After coating, drying was carried out at 90° C. for 30 seconds, while curing agent curing was carried out at 50° C. for 24 hours.

| <Barrier Layer Forming Coating Composition> Layer thickness of 0.5 μm | |
|---|---|
| BX-1 (polyvinyl butyral resin) (Eslec BX-1, manufactured by Sekisui Kagaku Co., Ltd.) | 4 parts |
| Toughtex M-1913 (manufactured by Asahi Kasei Co., Ltd.) | 4 parts |
| Curing agent polyisocyanate (Coronate HX, manufactured by Nippon Urethane Co., Ltd.) | 2 parts |
| Toluene | 50 parts |
| Methyl ethyl ketone | 40 parts |

After coating, drying was carried out at 70° C. for 30 seconds.

| <Adhesion Layer Forming Coating Composition> Layer thickness of 9.3 μm | |
|---|---|
| Urethane modified ethylene ethyl acrylate copolymer (Hightech S6254B, manufactured by Toho Kagaku Kogyo Co., Ltd.) | 8 parts |
| Polyacrylic acid ester copolymer (Jurimer AT510, manufactured by Nippon Junyaku Co., Ltd.) | 2 parts |
| Water | 45 parts |
| Ethanol | 45 parts |

After coating, drying was carried out at 70° C. for 30 seconds.

Transparent Resin Transfer Foil 1, comprised of the releasing layer, the interlayer, and the adhesion layer comprised of the compositions as above, was prepared.

Transfer was carried out onto the aforesaid image receptive body which had been recorded with images and text, employing each transfer foil having a transparent protective layer, described in examples and comparative examples, employing a φ5 cm heating roller having a rubber hardness of 85 heated at 200° C. under a pressure of 150 kg/cm² over 1.2 seconds.

The aforesaid UV curable resin containing coating composition was applied onto the aforesaid image receptive body which had been transferred with the aforesaid Transfer Foil 1, employing a gravure roll coater having the specified ground pattern so as to obtain a coating weight of 20 g/m², and said UV curable resin containing coating composition 1 was cured under the conditions described below, whereby a UV cured protective layer was formed.

| Curing Conditions | |
| --- | --- |
| Light source | 60 w/cm² high pressure mercury lamp |
| Exposure distance | 10 cm |
| Exposure mode | light scanning at 3 cm/second |

| (UV Curable Resin Containing Coating Composition 1) | |
| --- | --- |
| Bis (3,4-epoxy-6-methylcyclohexylmethyl) adipate | 70 parts |
| Bisphenol A glycidyl ether | 10 parts |
| 1,4-Butanediol glycidyl ether | 13 parts |
| Triarylsulfoniumfluoroantimony | 7 parts |

| (Preparation of Actinic Light Curable Transfer Foil 2) | |
| --- | --- |
| (Releasing Layer Forming Coating Composition) Layer thickness of 0.2 μm | 10 parts |
| Polyvinyl alcohol (GL-05, manufactured by Nippon Gosei Kagaku Co., Ltd.) | |
| Water | 90 parts |

Said releasing layer was coated at a drying condition of 90° C./30 seconds.
(Actinic Light Curable Compound) Layer Thickness of 7.0 μm
A-9300 manufactured by Shin Nakamura Kagaku Co./ EA-1020 manufactured by Shin Nakamura Kagaku Co.=35/ 11.75 in part Reaction Initiator

| | |
| --- | --- |
| Irugacure 184, manufactured by Ciba-Geigy Japan Ltd. | 5 parts |
| Actinic light curable layer employing resins 1 | 48 parts |
| Surface active agent F-179, manufactured by Dainippon Ink | 0.25 part |
| Toluene | 500 parts |

After coating, said actinic light curable compound was dried at 90° C. for 30 seconds and was subjected to photocuring employing a mercury lamp (300 mJ/cm²).

| (Interlayer Forming Coating Composition) Layer thickness of 1.0 μm | |
| --- | --- |
| Polyvinyl butyral resin (Eslec BX-1, manufactured by Sekisui Kagaku Co., Ltd.) | 3.5 parts |
| Toughtex M-1913 (Asahi Kasei) | 5 parts |
| Curing agent | 1.5 parts |
| Polyisocyanate (Coronate HX, manufactured by Nippon Polyurethane Co.) | |
| Methyl ethyl ketone | 90 parts |

After coating, curing of said curing agent was carried out at 50° C. for 24 hours.

| <Adhesion Layer Forming Coating Composition> Layer thickness of 0.5 μm | |
| --- | --- |
| Urethane modified ethylene ethyl acrylate copolymer (Hightech S6254B, manufactured by Toho Kagaku Kogyo Co., Ltd.) | 8 parts |
| Polyacrylic acid ester copolymer (Jurimer AT510, Nihon Junyaku Co., Ltd.) | 2 parts |
| Water | 45 parts |
| Ethanol | 45 parts |

After coating, the resultant coating was dried at 70° C. for 30 seconds.

Further, transfer was carried out onto the aforesaid image receptive body or transparent resinous layer which had been recorded with images and text, or the scale pigment containing layer, employing actinic light curable transfer foil 2 constituted as above, while employing a φ5 cm heating roller having a rubber hardness of 85 heated at 200° C. under a pressure of 150 kg/cm² over 2 seconds.

| (Preparation of Optical Variable Device Transfer Foil 3) (Releasing Layer Forming Coating Composition) Layer thickness of 0.2 μm | |
| --- | --- |
| Polyvinyl alcohol (GL-05, manufactured by Nippon Gosei Kagaku Co., Ltd.) | 10 parts |
| Water | 90 parts |

After coating, drying was carried out at 90° C. for 30 seconds.

| (Optical Variable Device Layer) Layer thickness of 2 μm (Interlayer Forming Coating Composition) Layer thickness of 1.0 μm | |
| --- | --- |
| Polyvinyl butyral resin (Eslec BX-1, manufactured by Sekisui Kagaku Co., Ltd.) | 3.5 parts |
| Toughtex M-1913 (manufactured by Asahi Kasei) | 5 parts |
| Curing Agent | 1.5 parts |
| Polyisocyanate (Coronate HX, manufactured by Nippon Polyurethane Co., Ltd.) | |
| Methyl ethyl ketone | 90 parts |

After coating, drying was carried out at 90° C. for 30 seconds, and after coating, curing of the curing agent was carried out at 50° C. for 24 hours.

| <Adhesion Layer Forming Coating Composition> Layer thickness of 0.5 μm | |
| --- | --- |
| Urethane modified ethylene ethyl acrylate copolymer (Hightech S6254B), manufactured by Toho Kagaku Kogyo Co., Ltd.) | 8 parts |
| Polyacrylic acid ester copolymer (Jurimer AT510, manufactured by Nihon Junyaku Co., Ltd.) | 2 parts |
| Water | 45 parts |
| Ethanol | 45 parts |

After coating, drying was carried out at 70° C. for 30 seconds.

Further, transfer was carried out onto the aforesaid image receptive body which had been recorded with images and text, employing optical variable device transfer foil 3 constituted as above, while employing a ϕ5 cm heating roller having a rubber hardness of 85 heated at 200° C. under a pressure of 150 kg/cm2 over 1.2 seconds.

<Evaluation of Surface Smoothness of IC Card>

Surface irregularities were evaluated by printability onto IC cards. The printed portion was evaluated while excluding the IC chip portion.

A: good printing was noted
B: the printing portion was slightly blurred
C: the printing portion was definitely blurred.

(Durability Evaluation>

A 4 mmϕ iron pin was inserted into a card at 10 mm from the end (the short edge) of the card and the card was subjected to a bending test. Subsequently, breaking wire of the antenna was inspected while evaluating communication capability. The bending tests were carried out 5 times per one sample.

A: Breaking wire did not occur in 5 times
B: Breaking wire did not occur in at least 3 times
C: Breaking wire occurred in 5 times.

<Detectability of IC Chip on the Card>

Evaluation was carried out whether it was possible to visually detect the IC chip or not.

A: it was impossible to visually detect the IC chip
B: it was possible to slightly detect the IC chip
C: It is possible to definitely detect the IC chip.

TABLE 1-1

Figure 23:
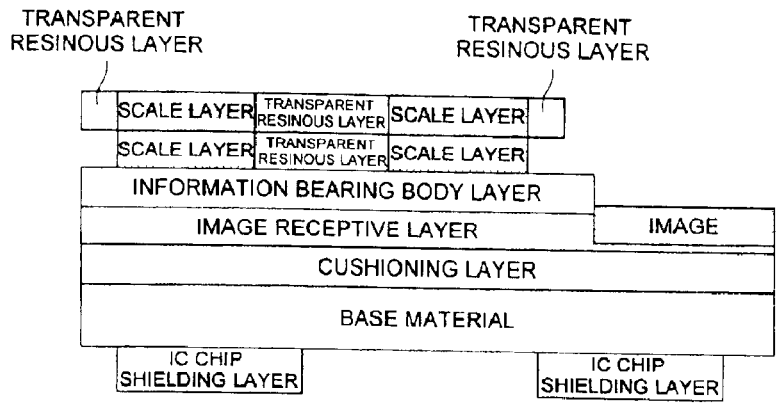
FIG. 23 is a view showing the first embodiment of a front sheet.
Figure 23:
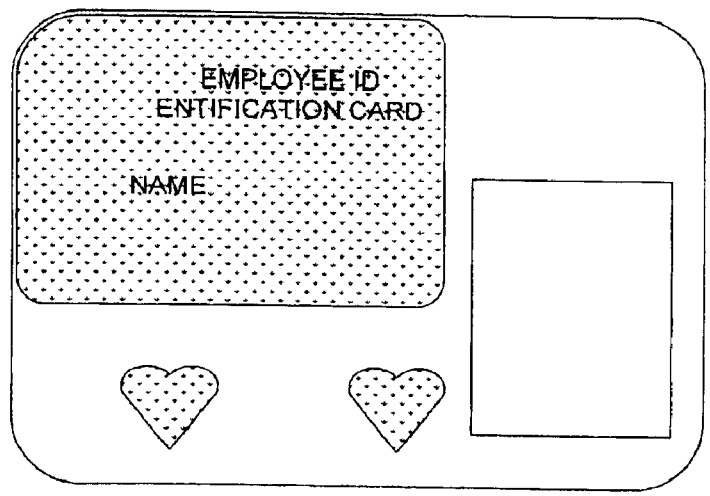
Figure 23:
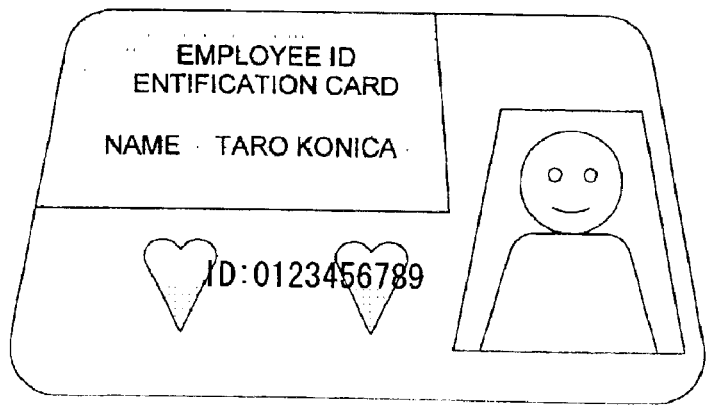
Figure 24:
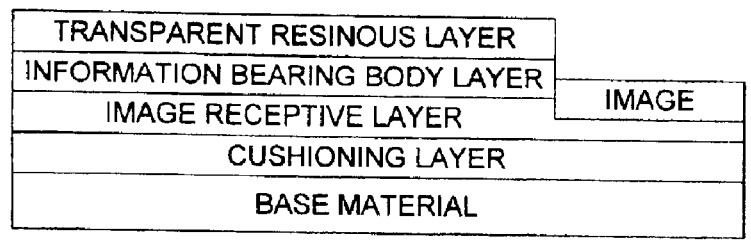
FIG. 24 is a view showing the second embodiment of a front sheet.
Figure 24:
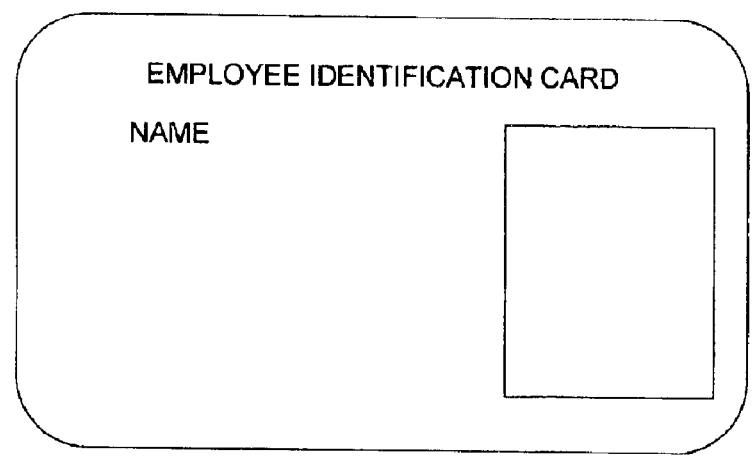
Figure 24:
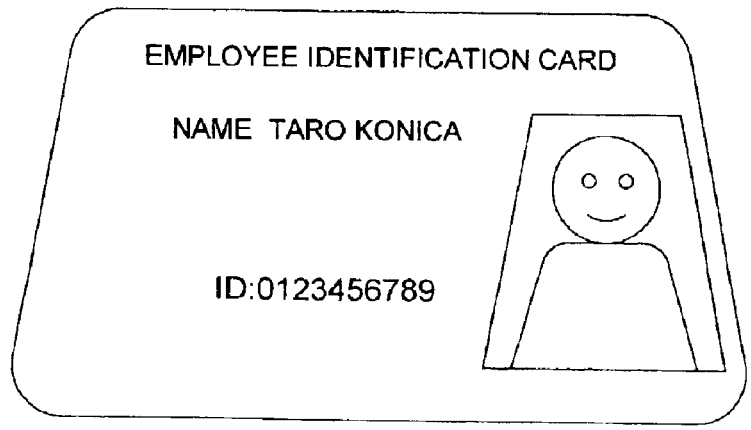
Figure 25:
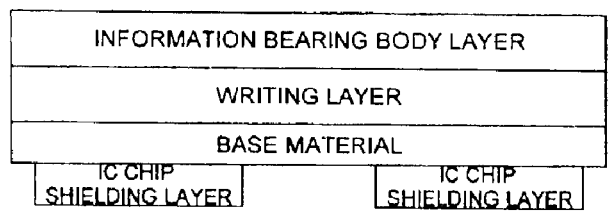
FIG. 25 is a view showing the first embodiment of a rear sheet.
Figure 25:
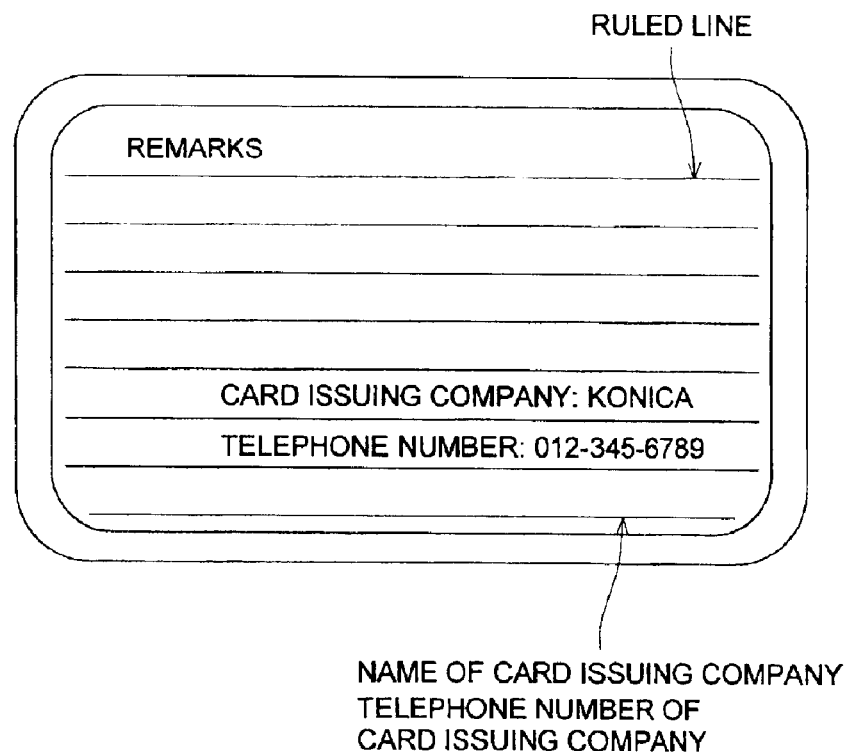

| | IC Card Base Material | | | | | | |
| --- | --- | --- | --- | --- | --- | --- | --- |
| | Front Sheet for IC Card Base Material | Cross-Sectional View of Front Sheet | Surface View of Front Sheet | Rear Sheet for IC Card Base Material | Cross-Sectional View of Rear Sheet | Surface View of Rear Sheet | Electronic Part |
| Example 1 | 1 | FIG. 23 (a) | FIG. 23 (b) | 2 | FIG. 26 (a) | FIG. 26 (b) | 1 |
| Example 2 | 1 | FIG. 23 (a) | FIG. 23 (b) | 2 | FIG. 26 (a) | FIG. 26 (b) | 1 |
| Example 3 | 2 | FIG. 24 (a) | FIG. 24 (b) | 1 | FIG. 25 (a) | FIG. 25 (b) | 1 |
| Example 4 | 2 | FIG. 24 (a) | FIG. 24 (b) | 2 | FIG. 26 (a) | FIG. 26 (b) | 2 |
| Example 5 | 2 | FIG. 24 (a) | FIG. 24 (b) | 2 | FIG. 26 (a) | FIG. 26 (b) | 1 |
| Example 6 | 1 | FIG. 23 (a) | FIG. 23 (b) | 2 | FIG. 26 (a) | FIG. 26 (b) | 1 |
| Example 7 | 2 | FIG. 24 (a) | FIG. 24 (b) | 1 | FIG. 25 (a) | FIG. 25 (b) | 1 |
| Example 8 | 2 | FIG. 24 (a) | FIG. 24 (b) | 1 | FIG. 26 (a) | FIG. 26 (b) | 2 |
| Example 9 | 1 | FIG. 23 (a) | FIG. 23 (b) | 2 | FIG. 26 (a) | FIG. 26 (b) | 1 |
| Example 10 | 1 | FIG. 23 (a) | FIG. 23 (b) | 2 | FIG. 26 (a) | FIG. 26 (b) | 1 |
| Example 11 | 1 | FIG. 23 (a) | FIG. 23 (b) | 2 | FIG. 26 (a) | FIG. 26 (b) | 1 |
| Example 12 | 1 | FIG. 23 (a) | FIG. 23 (b) | 2 | FIG. 26 (a) | FIG. 26 (b) | 1 |
| Example 13 | 2 | FIG. 24 (a) | FIG. 24 (b) | 1 | FIG. 25 (a) | FIG. 25 (b) | 1 |
| Example 14 | 2 | FIG. 24 (a) | FIG. 24 (b) | 1 | FIG. 25 (a) | FIG. 25 (b) | 1 |
| Example 15 | 2 | FIG. 24 (a) | FIG. 24 (b) | 1 | FIG. 25 (a) | FIG. 25 (b) | 1 |
| Example 16 | 2 | FIG. 24 (a) | FIG. 24 (b) | 2 | FIG. 26 (a) | FIG. 26 (b) | 2 |
| Example 17 | 2 | FIG. 24 (a) | FIG. 24 (b) | 2 | FIG. 26 (b) | FIG. 26 (b) | 1 |
| Example 18 | 2 | FIG. 24 (a) | FIG. 24 (b) | 2 | FIG. 26 (a) | FIG. 26 (b) | 2 |
| Example 19 | 2 | FIG. 24 (a) | FIG. 24 (b) | 2 | FIG. 26 (a) | FIG. 26 (b) | 2 |
| Comparative Example 1 | 2 | FIG. 24 (a) | FIG. 24 (b) | 2 | FIG. 26 (a) | FIG. 26 (b) | 1 |
| Comparative Example 2 | 2 | FIG. 24 (a) | FIG. 24 (b) | 2 | FIG. 26 (a) | FIG. 26 (b) | 1 |
| Comparative Example 3 | 2 | FIG. 24 (a) | FIG. 24 (b) | 2 | FIG. 26 (a) | FIG. 26 (b) | 1 |
| Comparative Example 4 | 2 | FIG. 24 (a) | FIG. 24 (b) | 2 | FIG. 26 (a) | FIG. 26 (b) | 1 |

TABLE 1-2

Figure 6:
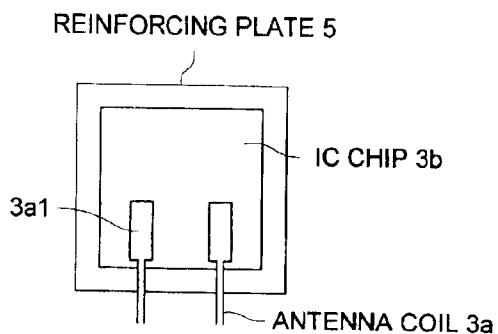
FIG. 6 is a schematic top view of the peripheral section of an IC chip.

| | Antenna Shape | | | | | | | | Schematic View of IC Chip Shielding Layer | Cross-Sectional View of IC Card Base Material |
|---|---|---|---|---|---|---|---|---|---|---|
| | | | | | Applicability | | | | | |
| | X1 | Y1 | X2 | Y2 | Formula 1 | Formula 2 | Formula 3 | Formula 4 | | |
| Example 1 | 80 | 40 | 105 | 15 | A | A | A | A | FIG. 6 | FIG. 4 |
| Example 2 | 75 | 45 | 90 | 30 | A | A | A | A | FIG. 6 | FIG. 4 |
| Example 3 | 80 | 40 | 105 | 15 | A | A | A | A | FIG. 6 | FIG. 3 |
| Example 4 | 75 | 45 | 90 | 30 | A | A | A | A | FIG. 7 | FIG. 5 |
| Example 5 | 75 | 45 | 90 | 30 | A | A | A | A | — | FIG. 2 |
| Example 6 | 75 | 45 | 90 | 30 | A | A | A | A | FIG. 6 | FIG. 4 |
| Example 7 | 80 | 40 | 105 | 15 | A | A | A | A | FIG. 6 | FIG. 3 |
| Example 8 | 75 | 45 | 90 | 30 | A | A | A | A | FIG. 7 | FIG. 5 |
| Example 9 | 80 | 40 | 105 | 15 | A | A | A | A | FIG. 6 | FIG. 4 |
| Example 10 | 70 | 50 | 90 | 30 | A | A | A | A | FIG. 6 | FIG. 4 |
| Example 11 | 75 | 45 | 105 | 15 | A | A | A | A | FIG. 6 | FIG. 4 |
| Example 12 | 70 | 50 | 90 | 30 | A | A | A | A | FIG. 6 | FIG. 5 |
| Example 13 | 80 | 40 | 105 | 15 | A | A | A | A | FIG. 6 | FIG. 3 |
| Example 14 | 75 | 45 | 90 | 30 | A | A | A | A | FIG. 6 | FIG. 3 |
| Example 15 | 70 | 50 | 90 | 30 | A | A | A | A | FIG. 6 | FIG. 3 |
| Example 16 | 80 | 40 | 105 | 15 | A | A | A | A | FIG. 7 | FIG. 5 |
| Example 17 | 80 | 40 | 105 | 15 | A | A | A | A | — | FIG. 2 |
| Example 18 | 65 | 55 | 105 | 15 | C | C | A | A | FIG. 7 | FIG. 5 |
| Example 19 | 70 | 50 | 90 | 30 | A | A | A | A | FIG. 7 | FIG. 5 |
| Comparative Example 1 | 60 | 60 | 60 | 60 | C | C | C | C | — | FIG. 2 |
| Comparative Example 2 | 65 | 55 | 65 | 55 | C | C | C | C | — | FIG. 2 |
| Comparative Example 3 | 60 | 60 | 60 | 60 | C | C | C | C | — | FIG. 2 |
| Comparative Example 4 | 65 | 55 | 65 | 55 | C | C | C | C | — | 2 |

TABLE 1-3

| | IC Card Preparation Method | | Final Embodiment View of IC Card |
|---|---|---|---|
| | Image Recording Body Preparation Apparatus | Transfer Foil | |
| Example 1 | FIG. 13 | 1 | FIG. 23 (c) |
| Example 2 | FIG. 13 | 1 | FIG. 23 (c) |
| Example 3 | FIG. 13 | 1 | FIG. 24 (c) |
| Example 4 | FIG. 13 | 1 | FIG. 24 (c) |
| Example 5 | FIG. 13 | 1 | FIG. 24 (c) |
| Example 6 | FIG. 17 | 2 | FIG. 23 (c) |
| Example 7 | FIG. 17 | 2 | FIG. 24 (c) |
| Example 8 | FIG. 17 | 2 | FIG. 24 (c) |
| Example 9 | FIG. 15 | card side/card uppermost layer = 2/2 | FIG. 23 (c) |
| Example 10 | FIG. 15 | card side/card uppermost layer = 3/2 | FIG. 23 (c) |
| Example 11 | FIG. 15 | card side/card uppermost layer = 2/2 | FIG. 23 (c) |
| Example 12 | FIG. 15 | card side/card uppermost layer = 2/2 | FIG. 23 (c) |
| Example 13 | FIG. 15 | card side/card uppermost layer = 3/2 | FIG. 24 (c) |
| Example 14 | FIG. 15 | card side/card uppermost layer = 2/2 | FIG. 24 (c) |
| Example 15 | FIG. 15 | card side/card uppermost layer = 2/2 | FIG. 24 (c) |
| Example 16 | FIG. 15 | card side/card uppermost layer = 2/2 | FIG. 24 (c) |
| Example 17 | FIG. 15 | card side/card uppermost layer = 2/2 | FIG. 24 (c) |
| Example 18 | FIG. 15 | card side/card uppermost layer = 2/2 | FIG. 24 (c) |
| Example 19 | FIG. 15 | card side/card uppermost layer = 2/2 | FIG. 24 (c) |
| Comparative Example 1 | FIG. 13 | 1 | FIG. 24 (c) |
| Comparative Example 2 | FIG. 13 | 1 | FIG. 24 (c) |
| Comparative Example 3 | FIG. 15 | card side/card uppermost layer = 2/2 | FIG. 24 (c) |
| Comparative Example 4 | FIG. 15 | card side/card uppermost layer = 2/2 | FIG. 24 (c) |

TABLE 1-4

|  | IC Card Evaluation Result | | |
| --- | --- | --- | --- |
|  | Smoothness | Durability | IC Chip Detectability |
| Example 1 | A | A | A |
| Example 2 | A | A | A |
| Example 3 | A | A | A |
| Example 4 | A | A | B |
| Example 5 | A | A | C |
| Example 6 | A | A | A |
| Example 7 | A | A | A |
| Example 8 | A | A | B |
| Example 9 | A | A | A |
| Example 10 | A | A | A |
| Example 11 | A | A | A |
| Example 12 | A | A | A |
| Example 13 | A | A | A |
| Example 14 | A | A | A |
| Example 15 | A | A | A |
| Example 16 | A | A | B |
| Example 17 | A | A | C |
| Example 18 | B | B | B |
| Example 19 | A | A | B |
| Comparative Example 1 | D | C | C |
| Comparative Example 2 | C | C | C |
| Comparative Example 3 | D | C | C |
| Comparative Example 4 | C | C | C |

EFFECTS OF THE INVENTION

As noted above, in the present invention, the surface smoothness as well as the durability of the IC card is enhanced due to the specified antenna shape of the antennae coil.

Further, the surface smoothness as well as the durability of the IC card is enhanced due to the fact that the antenna shape of the connecting section between the antenna coil and the IC chip holds the specified relation ship.

Still further, durability and IC chip protection is enhanced by having an IC chip hiding part to shield at least 5 percent of the IC chip or the reinforcing plate.

What is claimed is:

1. An IC card comprising:
    a first sheet member;
    a second sheet member; and
    a core layer fixed therein an electronic part by an adhesive agent and provided between the first sheet member and the second sheet member, the electronic part comprising an antenna coil formed by an antenna wire and an IC module comprising an IC chip,
    wherein the antenna wire has a structure represented by following General Formula 1, Antenna Shape $Y1 \times 7.0 \geq$ Antenna Shape $X1 \geq$ Antenna Shape $Y1 \times 1.2$ wherein Antenna Shape X1 represents the cross sectional width of the antenna wire being parallel to the surface of the IC card; and Antenna Shape Y1 represents the cross sectional width of the antenna wire being perpendicular to the surface of the IC card.

2. The IC card of claim 1, wherein the electronic part further comprises a connecting section between the antenna coil and the IC chip, the connecting section having a structure represented by following General Formula 2, Antenna Shape $Y2 \times 7.0 \geq$ Antenna Shape $X2 \geq$ Antenna Shape $Y2 \times 1.2$ wherein Antenna Shape X2 represents the cross sectional width of the connecting section being parallel to the surface of the IC card; and Antenna Shape Y2 represents the cross sectional width of the connecting section being perpendicular to the surface of the IC card.

3. The IC card of claim 2, wherein the structure of the antenna wire and the connecting section satisfy the following General Formula 3 and General Formula 4, Antenna Shape Y1>Antenna Shape Y2

Antenna Shape X2>Antenna Shape X1.

4. The IC card of claim 1, wherein the IC card further comprising a image receptive layer and a write-able layer at least on a part of surface of the IC card,
    wherein the image receptive layer comprises personal identification information including a name and a face image, the personal identification information being recorded by a sublimation thermal transfer method, a fusion thermal transfer method or an ink jet method.

5. The IC card of claim 1, wherein the adhesive agent comprises a adhesive agent being capable of being hardened without heat.

6. The IC card of claim 4, wherein the IC card further comprises a transparent protective layer on the image receptive layer, the transparent protective layer comprising an actinic light curable resin.

7. The IC card of claim 1, wherein the antenna wire is consisted of copper windings.

8. The IC card of claim 1, wherein the X1 and Y1 is in the range of 0.1 to 800.0 $\mu$m.

9. The IC card of claim 1, wherein the antenna wire further has a structure represented by the following formula, Antenna Shape $Y1 \times 2.0 \geq$ Antenna Shape $X1 \geq$ Antenna Shape $Y1 \times 1.2$ wherein Antenna Shape X1 represents the cross sectional width of the antenna wire being parallel to the surface of the IC card; and Antenna Shape Y1 represents the cross sectional width of the antenna wire being perpendicular to the surface of the IC card.

10. An IC card comprising:
    a first sheet member;
    a second sheet member; and
    a core layer fixed therein an electronic part by an adhesive agent and provided between the first sheet member and the second sheet member, the electronic part comprising an antenna coil formed by an antenna wire, an IC module comprising an IC chip and a connecting section between the antenna coil and the IC chip,
    wherein the connecting section has a structure represented by following General Formula 2, Antenna Shane $Y2 \times 7.0 \geq$ Antenna Shape $X2 \geq$ Antenna Shape $Y2 \times 1.2$ wherein Antenna Shape X2 represents the cross sectional width of the connecting section being parallel to the surface of the IC card; and Antenna Shape Y2 represents the cross sectional width of the connecting section being perpendicular to the surface of the IC card.

11. The IC card of claim 10, wherein the connecting section is consisted of wire.

12. The IC card of claim 10, wherein the X2 and Y2 is in the range of 0.1 to 800.0 µm.

13. An IC card comprising:

a first sheet member;

a second sheet member; and a core layer fixed therein an electronic part by an adhesive agent and provided between the first sheet member and the second sheet member, the electronic part comprising an antenna coil formed by an antenna wire and an IC module comprising a reinforcing plate having thereon an IC chip, wherein the IC card further comprises a IC chip hiding part to hide at least 5% of the IC chip or the reinforcing plate.

14. The IC card of claim 13, wherein the IC chip hiding part is printed on the first sheet member or the second sheet member.

15. The IC card of claim 13, wherein the difference in transmission density between the hiding part and an IC chip layer which is located in a portion of the IC card in which the electronic part is not arranged is at most 0.7.

* * * * *